(12) United States Patent
Zhou et al.

(10) Patent No.: US 10,333,090 B2
(45) Date of Patent: *Jun. 25, 2019

(54) LIGHT-EMITTING DEVICE INCLUDING QUANTUM DOTS

(71) Applicant: SAMSUNG RESEARCH AMERICA, INC., Mountain View, CA (US)

(72) Inventors: Zhaoqun Zhou, Bridgewater, NJ (US); Peter T. Kazlas, Sudbury, MA (US); Mead Misic, Stoneham, MA (US); Zoran Popovic, Mississauga (CA); John Spencer Morris, Houston, TX (US)

(73) Assignee: SAMSUNG RESEARCH AMERICA, INC., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/650,214

(22) Filed: Jul. 14, 2017

(65) Prior Publication Data

US 2018/0013088 A1 Jan. 11, 2018

Related U.S. Application Data

(63) Continuation of application No. 12/896,856, filed on Oct. 2, 2010, now Pat. No. 9,793,505, which is a
(Continued)

(51) Int. Cl.
*H01L 51/50* (2006.01)
*B82Y 20/00* (2011.01)

(52) U.S. Cl.
CPC .......... *H01L 51/5012* (2013.01); *B82Y 20/00* (2013.01); *H01L 51/5048* (2013.01); *H01L 51/5088* (2013.01); *H01L 2251/552* (2013.01)

(58) Field of Classification Search
CPC ............. H01L 51/5012; H01L 51/5048; H01L 51/5088; H01L 2251/552; B82Y 20/00
See application file for complete search history.

(56) References Cited

U.S. PATENT DOCUMENTS

| 3,714,339 A | 1/1973 | Vecht |
| 4,907,043 A | 3/1990 | Uekita et al. |
| (Continued) | | |

FOREIGN PATENT DOCUMENTS

| CN | 1245581 A | 2/2000 |
| CN | 1289525 A | 3/2001 |
| (Continued) | | |

OTHER PUBLICATIONS

Chinese Office Action dated Apr. 16, 2018, in Chinese Patent Application No. 201610206693.9 with English Summary, 12 pages.
(Continued)

*Primary Examiner* — Walter H Swanson
(74) *Attorney, Agent, or Firm* — Cantor Colburn LLP

(57) ABSTRACT

A light emitting device including an emissive material comprising quantum dots is disclosed. In one embodiment, the device includes a cathode, a layer comprising a material capable of transporting and injection electrons comprising an inorganic material, an emissive layer comprising quantum dots, a layer comprising a material capable of transporting holes, a layer comprising a hole injection material, and an anode. In certain embodiments, the hole injection material can be a p-type doped hole transport material. In certain preferred embodiments, quantum dots comprise semiconductor nanocrystals. In another aspect of the invention, there is provided a light emitting device wherein the device has an initial turn-on voltage that is not greater than
(Continued)

1240/λ, wherein λ represents the wavelength (nm) of light emitted by the emissive layer. Other light emitting devices and a method are disclosed.

13 Claims, 16 Drawing Sheets

Related U.S. Application Data continuation of application No. PCT/US2009/002123, filed on Apr. 3, 2009.

(60) Provisional application No. 61/042,154, filed on Apr. 3, 2008.

(56) References Cited

U.S. PATENT DOCUMENTS

| | | |
|---|---|---|
| 5,132,051 A | 7/1992 | Herron et al. |
| 5,152,229 A | 10/1992 | Nimmo |
| 5,162,939 A | 11/1992 | Herron et al. |
| 5,200,668 A | 4/1993 | Ohashi et al. |
| 5,238,607 A | 8/1993 | Herron et al. |
| 5,244,828 A | 9/1993 | Okada et al. |
| 5,262,357 A | 11/1993 | Alivisatos et al. |
| 5,281,543 A | 1/1994 | Fukuzawa et al. |
| 5,283,132 A | 2/1994 | Ogura et al. |
| 5,434,878 A | 7/1995 | Lawandy |
| 5,442,254 A | 8/1995 | Jaskie |
| 5,470,910 A | 11/1995 | Spanhel et al. |
| 5,474,591 A | 12/1995 | Wells et al. |
| 5,505,928 A | 4/1996 | Alivisatos et al. |
| 5,512,131 A | 4/1996 | Kumar et al. |
| 5,525,377 A | 6/1996 | Gallagher et al. |
| 5,527,386 A | 6/1996 | Statz |
| 5,532,184 A | 7/1996 | Kato |
| 5,532,486 A | 7/1996 | Stanchina et al. |
| 5,534,056 A | 7/1996 | Kuehnle et al. |
| 5,537,000 A | 7/1996 | Alivisatos et al. |
| 5,559,057 A | 9/1996 | Goldstein |
| 5,578,379 A | 11/1996 | Stutzmann et al. |
| 5,586,249 A | 11/1996 | Goldstein |
| 5,607,876 A | 3/1997 | Biegelsen et al. |
| 5,663,573 A | 9/1997 | Epstein et al. |
| 5,736,754 A | 4/1998 | Shi et al. |
| 5,766,779 A | 6/1998 | Shi et al. |
| 5,783,292 A | 7/1998 | Tokito et al. |
| 5,866,039 A | 2/1999 | Morton |
| 5,874,803 A | 2/1999 | Garbuzov et al. |
| 5,882,779 A | 3/1999 | Lawandy |
| 5,906,670 A | 5/1999 | Dobson et al. |
| 5,908,608 A | 6/1999 | Lawandy et al. |
| 5,917,279 A | 6/1999 | Elschner et al. |
| 5,949,089 A | 9/1999 | Kim et al. |
| 5,958,573 A | 9/1999 | Spitler |
| 5,965,212 A | 10/1999 | Dobson et al. |
| 5,981,092 A | 11/1999 | Arai et al. |
| 5,985,173 A | 11/1999 | Gray et al. |
| 5,997,958 A | 12/1999 | Sato et al. |
| 6,023,073 A | 2/2000 | Strite |
| 6,036,886 A | 3/2000 | Chhabra et al. |
| 6,046,543 A | 4/2000 | Bulovic et al. |
| 6,103,868 A | 8/2000 | Heath et al. |
| 6,111,274 A | 8/2000 | Arai |
| 6,114,038 A | 9/2000 | Castro et al. |
| 6,129,986 A | 10/2000 | Bessho et al. |
| 6,157,047 A | 12/2000 | Fujita et al. |
| 6,179,912 B1 | 1/2001 | Barbera-Guillem et al. |
| 6,180,239 B1 | 1/2001 | Whitesides et al. |
| 6,194,237 B1 | 2/2001 | Kim et al. |
| 6,207,229 B1 | 3/2001 | Bawendi et al. |
| 6,225,198 B1 | 5/2001 | Alivisatos et al. |
| 6,235,618 B1 | 5/2001 | Jeong-Sook et al. |
| 6,239,355 B1 | 5/2001 | Salafsky |
| 6,241,819 B1 | 6/2001 | Bhargava et al. |
| 6,242,076 B1 | 6/2001 | Andriash |
| 6,249,372 B1 | 6/2001 | Kobayashi et al. |
| 6,251,303 B1 | 6/2001 | Bawendi et al. |
| 6,262,129 B1 | 7/2001 | Murray et al. |
| 6,287,928 B1 | 9/2001 | Yamashita |
| 6,294,401 B1 | 9/2001 | Jacobson et al. |
| 6,306,610 B1 | 10/2001 | Bawendi et al. |
| 6,313,261 B1 | 11/2001 | Samuel et al. |
| 6,322,901 B1 | 11/2001 | Bawendi et al. |
| 6,326,144 B1 | 12/2001 | Bawendi et al. |
| 6,329,668 B1 | 12/2001 | Razeghi |
| 6,333,110 B1 | 12/2001 | Barbera-Guillem |
| 6,379,635 B2 | 4/2002 | O'Brien et al. |
| 6,391,273 B1 | 5/2002 | Konrad et al. |
| 6,404,126 B1 | 6/2002 | Arai et al. |
| 6,416,888 B1 | 7/2002 | Kawamura et al. |
| 6,440,213 B1 | 8/2002 | Alivisatos et al. |
| 6,447,698 B1 | 9/2002 | Ihara et al. |
| 6,464,898 B1 | 10/2002 | Tomoike et al. |
| 6,475,886 B2 | 11/2002 | Kim et al. |
| 6,501,091 B1 | 12/2002 | Bawendi et al. |
| 6,512,172 B1 | 1/2003 | Salafsky et al. |
| 6,515,314 B1 | 2/2003 | Duggal et al. |
| 6,518,168 B1 | 2/2003 | Clem et al. |
| 6,544,870 B2 | 4/2003 | Park et al. |
| 6,576,291 B2 | 6/2003 | Bawendi et al. |
| 6,579,422 B1 | 6/2003 | Kakinuma |
| 6,586,785 B2 | 7/2003 | Flagan et al. |
| 6,593,690 B1 | 7/2003 | McCormick et al. |
| 6,608,439 B1 | 8/2003 | Sokolik et al. |
| 6,617,583 B1 | 9/2003 | Bawendi et al. |
| 6,639,354 B1 | 10/2003 | Kojima et al. |
| 6,649,138 B2 | 11/2003 | Adams et al. |
| 6,656,608 B1 | 12/2003 | Kita et al. |
| 6,682,596 B2 | 1/2004 | Zehnder et al. |
| 6,697,403 B2 | 2/2004 | Lee et al. |
| 6,703,781 B2 | 3/2004 | Zovko |
| 6,706,551 B2 | 3/2004 | Andriessen |
| 6,710,366 B1 | 3/2004 | Lee et al. |
| 6,724,141 B2 | 4/2004 | Andriessen |
| 6,753,272 B1 | 6/2004 | Lee et al. |
| 6,753,273 B2 | 6/2004 | Holonyak, Jr. et al. |
| 6,777,706 B1 | 8/2004 | Tessler et al. |
| 6,780,242 B2 | 8/2004 | Norris |
| 6,797,412 B1 | 9/2004 | Jain et al. |
| 6,803,719 B1 | 10/2004 | Miller et al. |
| 6,815,064 B2 | 11/2004 | Treadway et al. |
| 6,821,559 B2 | 11/2004 | Eberspacher et al. |
| 6,838,743 B2 | 1/2005 | Yamada et al. |
| 6,838,816 B2 | 1/2005 | Su et al. |
| 6,846,565 B2 | 1/2005 | Korgel et al. |
| 6,849,862 B2 | 2/2005 | Nikolaev et al. |
| 6,853,013 B2 | 2/2005 | Hirai et al. |
| 6,855,202 B2 | 2/2005 | Alivisatos et al. |
| 6,859,477 B2 | 2/2005 | Deppe et al. |
| 6,861,155 B2 | 3/2005 | Bawendi et al. |
| 6,861,674 B2 | 3/2005 | Perlo et al. |
| 6,869,545 B2 | 3/2005 | Peng et al. |
| 6,869,864 B2 | 3/2005 | Yim et al. |
| 6,872,249 B2 | 3/2005 | Peng et al. |
| 6,872,450 B2 | 3/2005 | Liu et al. |
| 6,890,777 B2 | 5/2005 | Bawendi et al. |
| 6,918,946 B2 | 7/2005 | Korgel et al. |
| 6,939,604 B1 | 9/2005 | Guyot-Sionnest et al. |
| 6,940,087 B2 | 9/2005 | Komoda et al. |
| 6,949,879 B1 | 9/2005 | Wright et al. |
| 6,955,856 B2 | 10/2005 | Lee et al. |
| 6,977,182 B2 | 12/2005 | Sato et al. |
| 6,992,317 B2 | 1/2006 | Jain et al. |
| 6,995,505 B2 | 2/2006 | Kim et al. |
| 7,005,669 B1 | 2/2006 | Lee |
| 7,008,559 B2 | 3/2006 | Chen |
| 7,015,139 B2 | 3/2006 | Yamashita |
| 7,015,498 B2 | 3/2006 | Ebe et al. |
| 7,015,640 B2 | 3/2006 | Schaepkens et al. |
| 7,056,471 B1 | 6/2006 | Han et al. |
| 7,147,712 B2 | 12/2006 | Zehnder et al. |
| 7,160,613 B2 | 1/2007 | Bawendi et al. |
| 7,172,791 B2 | 2/2007 | Treadway et al. |

(56) References Cited

U.S. PATENT DOCUMENTS

| | | |
|---|---|---|
| 7,175,948 B2 | 2/2007 | Yoshihara et al. |
| 7,199,393 B2 | 4/2007 | Park et al. |
| 7,208,768 B2 | 4/2007 | Ono et al. |
| 7,250,082 B2 | 7/2007 | Jang et al. |
| 7,253,452 B2 | 8/2007 | Steckel et al. |
| 7,326,908 B2 | 2/2008 | Sargent et al. |
| 7,332,211 B1 | 2/2008 | Bulovic et al. |
| 7,399,429 B2 | 7/2008 | Liu et al. |
| 7,422,790 B1 | 9/2008 | Scher et al. |
| 7,442,320 B2 | 10/2008 | Lee |
| 7,459,850 B2 | 12/2008 | Cok |
| 7,491,642 B2 | 2/2009 | Lewis et al. |
| 7,569,248 B2 | 8/2009 | Jang et al. |
| 7,592,618 B2 | 9/2009 | Khang et al. |
| 7,615,800 B2 | 11/2009 | Karen |
| 7,632,428 B2 | 12/2009 | Peng et al. |
| 7,645,397 B2 | 1/2010 | Parce et al. |
| 7,687,800 B1 | 3/2010 | Kar et al. |
| 7,700,200 B2 | 4/2010 | Bulovic et al. |
| 7,732,237 B2 | 6/2010 | Xie |
| 7,776,630 B1 | 8/2010 | Kar et al. |
| 7,777,233 B2 | 8/2010 | Kahen et al. |
| 7,855,091 B1 | 12/2010 | Kar et al. |
| 7,880,377 B2 | 2/2011 | Orita et al. |
| 7,910,400 B2 | 3/2011 | Kwon et al. |
| 7,919,012 B2 | 4/2011 | Peng et al. |
| 7,935,419 B1 | 5/2011 | Hollingsworth et al. |
| 7,964,278 B2 | 6/2011 | Banin et al. |
| 8,003,010 B2 | 8/2011 | Landry et al. |
| 8,012,604 B2 | 9/2011 | Kathirgamanathan et al. |
| 8,080,437 B2 | 12/2011 | Steckel et al. |
| 8,232,722 B2 | 7/2012 | Bawendi et al. |
| 8,334,527 B2 | 12/2012 | Iizumi et al. |
| 8,368,048 B2 | 2/2013 | Locascio et al. |
| 8,377,333 B2 | 2/2013 | Ramprasad et al. |
| 8,404,154 B2 | 3/2013 | Breen et al. |
| 8,470,617 B2 | 6/2013 | Coe-Sullivan et al. |
| 8,535,758 B2 | 9/2013 | Bulovic et al. |
| 8,563,143 B2 | 10/2013 | Park et al. |
| 8,610,232 B2 | 12/2013 | Coe-Sullivan et al. |
| 8,691,114 B2 | 4/2014 | Ramprasad et al. |
| 8,980,133 B2 | 3/2015 | Ramprasad |
| 9,054,329 B2 | 6/2015 | Coe-Sullivan et al. |
| 9,525,148 B2 | 12/2016 | Kazlas et al. |
| 9,755,172 B2 | 9/2017 | Kazlas et al. |
| 9,793,505 B2 | 10/2017 | Zhou et al. |
| 2001/0040232 A1 | 11/2001 | Bawendi et al. |
| 2001/0052752 A1 | 12/2001 | Ghosh et al. |
| 2001/0055764 A1 | 12/2001 | Empedocles et al. |
| 2002/0047551 A1 | 4/2002 | Rubner et al. |
| 2002/0055040 A1 | 5/2002 | Mukherjee et al. |
| 2002/0071952 A1 | 6/2002 | Bawendi et al. |
| 2002/0146590 A1 | 10/2002 | Matsuo et al. |
| 2002/0179898 A1* | 12/2002 | Marks ............... B82Y 10/00 257/40 |
| 2002/0180349 A1* | 12/2002 | Aziz ............... H01L 51/5221 313/506 |
| 2003/0010987 A1 | 1/2003 | Banin et al. |
| 2003/0017264 A1 | 1/2003 | Treadway et al. |
| 2003/0034486 A1 | 2/2003 | Korgel |
| 2003/0035917 A1 | 2/2003 | Hyman |
| 2003/0042850 A1 | 3/2003 | Bertram et al. |
| 2003/0059635 A1 | 3/2003 | Naasani |
| 2003/0071794 A1 | 4/2003 | Arakawa et al. |
| 2003/0106488 A1 | 6/2003 | Huang et al. |
| 2003/0127659 A1 | 7/2003 | Bawendi et al. |
| 2003/0142944 A1 | 7/2003 | Sundar et al. |
| 2003/0170927 A1 | 9/2003 | Holonyak, Jr. et al. |
| 2004/0000868 A1 | 1/2004 | Shimizu et al. |
| 2004/0023010 A1 | 2/2004 | Bulovic et al. |
| 2004/0033359 A1 | 2/2004 | Bawendi et al. |
| 2004/0091710 A1 | 5/2004 | Bawendi et al. |
| 2004/0110002 A1 | 6/2004 | Kim et al. |
| 2004/0137263 A1 | 7/2004 | Burn et al. |
| 2004/0178414 A1 | 9/2004 | Frey et al. |
| 2004/0202875 A1 | 10/2004 | Yitzchaik |
| 2004/0206942 A1 | 10/2004 | Hsu |
| 2004/0209115 A1 | 10/2004 | Thompson et al. |
| 2004/0227703 A1 | 11/2004 | Lamvik et al. |
| 2004/0241424 A1 | 12/2004 | Barbera-Guillem |
| 2004/0265622 A1 | 12/2004 | Sadasivan et al. |
| 2005/0001538 A1 | 1/2005 | Ozkan et al. |
| 2005/0006656 A1 | 1/2005 | Jain et al. |
| 2005/0012182 A1 | 1/2005 | Jang et al. |
| 2005/0014017 A1 | 1/2005 | Hosokawa et al. |
| 2005/0031888 A1 | 2/2005 | Bawendi et al. |
| 2005/0051766 A1 | 3/2005 | Stokes et al. |
| 2005/0051769 A1 | 3/2005 | Jang et al. |
| 2005/0051777 A1 | 3/2005 | Hill |
| 2005/0072989 A1 | 4/2005 | Bawendi et al. |
| 2005/0088380 A1 | 4/2005 | Bulovic et al. |
| 2005/0112849 A1 | 5/2005 | Stott et al. |
| 2005/0116621 A1 | 6/2005 | Bellmann et al. |
| 2005/0116633 A1 | 6/2005 | Yamazaki et al. |
| 2005/0117868 A1 | 6/2005 | Chen et al. |
| 2005/0126628 A1 | 6/2005 | Scher et al. |
| 2005/0129947 A1 | 6/2005 | Peng et al. |
| 2005/0135079 A1 | 6/2005 | Yin Chua et al. |
| 2005/0136258 A1 | 6/2005 | Nie et al. |
| 2005/0189534 A1 | 9/2005 | Guyot-Sionnest et al. |
| 2005/0206306 A1 | 9/2005 | Perlo et al. |
| 2005/0214536 A1 | 9/2005 | Schrier et al. |
| 2005/0230673 A1 | 10/2005 | Mueller et al. |
| 2005/0236556 A1 | 10/2005 | Sargent et al. |
| 2005/0258418 A1 | 11/2005 | Steckel et al. |
| 2005/0260440 A1 | 11/2005 | Seo et al. |
| 2005/0261400 A1 | 11/2005 | Yang et al. |
| 2005/0274944 A1 | 12/2005 | Jang et al. |
| 2005/0274994 A1 | 12/2005 | Rhodes |
| 2005/0276993 A1 | 12/2005 | Sohn et al. |
| 2005/0279989 A1 | 12/2005 | Li et al. |
| 2005/0287691 A1 | 12/2005 | Chen et al. |
| 2006/0001066 A1 | 1/2006 | Ping et al. |
| 2006/0001119 A1 | 1/2006 | Liu et al. |
| 2006/0014040 A1 | 1/2006 | Peng et al. |
| 2006/0014315 A1 | 1/2006 | Chan et al. |
| 2006/0019427 A1 | 1/2006 | Cao |
| 2006/0028882 A1 | 2/2006 | Qu |
| 2006/0034065 A1 | 2/2006 | Thurk |
| 2006/0043361 A1 | 3/2006 | Lee et al. |
| 2006/0046330 A1 | 3/2006 | Chen et al. |
| 2006/0060862 A1 | 3/2006 | Bawendi et al. |
| 2006/0062720 A1 | 3/2006 | Jang et al. |
| 2006/0062902 A1 | 3/2006 | Sager et al. |
| 2006/0063029 A1 | 3/2006 | Jang et al. |
| 2006/0068154 A1 | 3/2006 | Parce et al. |
| 2006/0105199 A1 | 5/2006 | Gerlach et al. |
| 2006/0105200 A1 | 5/2006 | Poplavskyy et al. |
| 2006/0114960 A1 | 6/2006 | Snee et al. |
| 2006/0119258 A1* | 6/2006 | Sakata ............... B82Y 20/00 313/504 |
| 2006/0127562 A1 | 6/2006 | Lewis et al. |
| 2006/0131361 A1 | 6/2006 | Eastman et al. |
| 2006/0157686 A1 | 7/2006 | Jang et al. |
| 2006/0157720 A1 | 7/2006 | Bawendi et al. |
| 2006/0158089 A1 | 7/2006 | Saito et al. |
| 2006/0196375 A1 | 9/2006 | Coe-Sullivan et al. |
| 2006/0197695 A1 | 9/2006 | Takeuchi et al. |
| 2006/0198128 A1 | 9/2006 | Piepgras et al. |
| 2006/0204675 A1 | 9/2006 | Gao et al. |
| 2006/0205142 A1 | 9/2006 | Ping et al. |
| 2006/0216759 A1 | 9/2006 | Naasani |
| 2006/0220528 A1 | 10/2006 | Engelhardt et al. |
| 2006/0232194 A1 | 10/2006 | Tung et al. |
| 2006/0236918 A1 | 10/2006 | Jun et al. |
| 2006/0244358 A1 | 11/2006 | Kim et al. |
| 2006/0273304 A1 | 12/2006 | Cok |
| 2007/0001581 A1 | 1/2007 | Stasiak et al. |
| 2007/0034856 A1 | 2/2007 | Ohsawa et al. |
| 2007/0057263 A1 | 3/2007 | Karen |
| 2007/0069202 A1 | 3/2007 | Choi et al. |
| 2007/0087219 A1 | 4/2007 | Ren et al. |
| 2007/0103068 A1* | 5/2007 | Bawendi ............... B82Y 20/00 313/506 |

(56) References Cited

U.S. PATENT DOCUMENTS

| | | |
|---|---|---|
| 2007/0111324 A1 | 5/2007 | Nie et al. |
| 2007/0164661 A1 | 7/2007 | Kuma |
| 2007/0170446 A1 | 7/2007 | Cho et al. |
| 2007/0190675 A1 | 8/2007 | Yamazaki et al. |
| 2007/0194694 A1* | 8/2007 | Reddy .......... B82Y 20/00 313/503 |
| 2007/0197003 A1 | 8/2007 | Yen et al. |
| 2007/0215856 A1 | 9/2007 | Kwon et al. |
| 2007/0243382 A1 | 10/2007 | Chan et al. |
| 2007/0246734 A1 | 10/2007 | Lee et al. |
| 2007/0257608 A1 | 11/2007 | Tyan et al. |
| 2007/0289491 A1 | 12/2007 | Peng et al. |
| 2008/0001167 A1 | 1/2008 | Coe-Sullivan et al. |
| 2008/0012031 A1 | 1/2008 | Jang et al. |
| 2008/0029760 A1 | 2/2008 | Jun et al. |
| 2008/0038558 A1 | 2/2008 | Landry et al. |
| 2008/0041814 A1 | 2/2008 | Romano et al. |
| 2008/0061683 A1 | 3/2008 | Bertram |
| 2008/0074050 A1 | 3/2008 | Chen et al. |
| 2008/0087882 A1 | 4/2008 | Lecloux et al. |
| 2008/0087899 A1 | 4/2008 | Sargent et al. |
| 2008/0142075 A1 | 6/2008 | Reddy et al. |
| 2008/0150425 A1 | 6/2008 | Cho et al. |
| 2008/0169753 A1 | 7/2008 | Skipor et al. |
| 2008/0172197 A1 | 7/2008 | Skipor et al. |
| 2008/0180020 A1 | 7/2008 | Cok |
| 2008/0202383 A1 | 8/2008 | Shi |
| 2008/0203895 A1 | 8/2008 | Miller et al. |
| 2008/0203899 A1 | 8/2008 | Miller et al. |
| 2008/0204366 A1 | 8/2008 | Kane et al. |
| 2008/0216891 A1 | 9/2008 | Harkness et al. |
| 2008/0217602 A1 | 9/2008 | Karen et al. |
| 2008/0217608 A1 | 9/2008 | Suzuki et al. |
| 2008/0218068 A1 | 9/2008 | Cok |
| 2008/0237612 A1 | 10/2008 | Cok |
| 2008/0238829 A1 | 10/2008 | Kane et al. |
| 2008/0278063 A1 | 11/2008 | Cok |
| 2008/0278064 A1 | 11/2008 | Kumaki et al. |
| 2008/0278069 A1 | 11/2008 | Nishi et al. |
| 2008/0297028 A1 | 12/2008 | Kane et al. |
| 2008/0297029 A1 | 12/2008 | Cok |
| 2008/0309234 A1 | 12/2008 | Cho et al. |
| 2009/0001349 A1 | 1/2009 | Karen |
| 2009/0001385 A1 | 1/2009 | Skipor et al. |
| 2009/0001403 A1 | 1/2009 | Skipor et al. |
| 2009/0002349 A1 | 1/2009 | Cok et al. |
| 2009/0002806 A1 | 1/2009 | Skipor et al. |
| 2009/0017268 A1 | 1/2009 | Skipor et al. |
| 2009/0039764 A1 | 2/2009 | Cho et al. |
| 2009/0059554 A1 | 3/2009 | Skipor et al. |
| 2009/0066223 A1 | 3/2009 | Yabe et al. |
| 2009/0087546 A1 | 4/2009 | Iizumi et al. |
| 2009/0087792 A1 | 4/2009 | Iizumi et al. |
| 2009/0152567 A1 | 6/2009 | Comerford et al. |
| 2009/0162011 A1 | 6/2009 | Coe-Sullivan et al. |
| 2009/0174022 A1 | 7/2009 | Coe-Sullivan et al. |
| 2009/0181478 A1 | 7/2009 | Cox et al. |
| 2009/0188558 A1 | 7/2009 | Jen et al. |
| 2009/0208753 A1 | 8/2009 | Coe-Sullivan et al. |
| 2009/0215208 A1 | 8/2009 | Coe-Sullivan et al. |
| 2009/0215209 A1 | 8/2009 | Anc et al. |
| 2009/0251759 A1 | 10/2009 | Domash et al. |
| 2009/0278141 A1 | 11/2009 | Coe-Sullivan et al. |
| 2009/0280586 A1 | 11/2009 | Coe-Sullivan |
| 2009/0283742 A1 | 11/2009 | Coe-Sullivan et al. |
| 2009/0283743 A1 | 11/2009 | Coe-Sullivan et al. |
| 2009/0283778 A1 | 11/2009 | Coe-Sullivan et al. |
| 2009/0286338 A1 | 11/2009 | Coe-Sullivan et al. |
| 2009/0320909 A1 | 12/2009 | Arango et al. |
| 2010/0001256 A1 | 1/2010 | Coe-Sullivan et al. |
| 2010/0012178 A1 | 1/2010 | Yang et al. |
| 2010/0014799 A1 | 1/2010 | Bulovic et al. |
| 2010/0025595 A1 | 2/2010 | Bawendi et al. |
| 2010/0044635 A1 | 2/2010 | Breen et al. |
| 2010/0044636 A1 | 2/2010 | Ramprasad et al. |
| 2010/0051870 A1 | 3/2010 | Ramprasad |
| 2010/0051901 A1 | 3/2010 | Kazlas et al. |
| 2010/0052512 A1 | 3/2010 | Clough et al. |
| 2010/0068468 A1 | 3/2010 | Coe-Sullivan et al. |
| 2010/0132770 A1 | 6/2010 | Beatty et al. |
| 2010/0134520 A1 | 6/2010 | Coe-Sullivan et al. |
| 2010/0237323 A1 | 9/2010 | Akai et al. |
| 2010/0243053 A1 | 9/2010 | Coe-Sullivan et al. |
| 2010/0264371 A1 | 10/2010 | Nick |
| 2010/0265307 A1 | 10/2010 | Linton et al. |
| 2010/0270511 A1 | 10/2010 | Locascio et al. |
| 2010/0283014 A1 | 11/2010 | Breen et al. |
| 2010/0283036 A1 | 11/2010 | Coe-Sullivan et al. |
| 2010/0283072 A1 | 11/2010 | Kazlas et al. |
| 2010/0289001 A1 | 11/2010 | Karen et al. |
| 2010/0289003 A1 | 11/2010 | Karen et al. |
| 2010/0314646 A1 | 12/2010 | Breen et al. |
| 2011/0025224 A1 | 2/2011 | Wood et al. |
| 2011/0080090 A1 | 4/2011 | Wood et al. |
| 2011/0081538 A1 | 4/2011 | Linton |
| 2011/0095261 A1 | 4/2011 | Kazlas et al. |
| 2011/0101303 A1 | 5/2011 | Choi et al. |
| 2011/0101479 A1 | 5/2011 | Arango et al. |
| 2011/0127932 A1 | 6/2011 | Halpert et al. |
| 2011/0140075 A1 | 6/2011 | Zhou et al. |
| 2011/0233483 A1 | 9/2011 | Breen et al. |
| 2011/0245533 A1 | 10/2011 | Breen et al. |
| 2011/0284819 A1 | 11/2011 | Kang et al. |
| 2011/0287566 A1 | 11/2011 | Jang et al. |
| 2011/0291071 A1 | 12/2011 | Kim et al. |
| 2012/0138894 A1 | 6/2012 | Qian et al. |
| 2012/0238047 A1 | 9/2012 | Bawendi et al. |
| 2012/0292594 A1 | 11/2012 | Zhou et al. |
| 2012/0292595 A1 | 11/2012 | Bawendi et al. |
| 2013/0009131 A1 | 1/2013 | Kazlas et al. |
| 2013/0037778 A1 | 2/2013 | Kazlas et al. |
| 2013/0221291 A1 | 8/2013 | Ramprasad et al. |
| 2013/0234109 A1 | 9/2013 | Breen et al. |
| 2014/0027713 A1 | 1/2014 | Cox et al. |

FOREIGN PATENT DOCUMENTS

| | | |
|---|---|---|
| CN | 1551697 A | 12/2004 |
| CN | 1967898 A | 5/2007 |
| EP | 1843411 A1 | 10/2007 |
| EP | 1980652 A2 | 10/2008 |
| JP | H11040361 A | 12/1999 |
| JP | 2003217861 A | 7/2003 |
| JP | 2004296950 A | 10/2004 |
| JP | 2004303592 A | 10/2004 |
| JP | 2005038634 A | 2/2005 |
| JP | 2006186317 A | 7/2006 |
| KR | 20060101184 A | 9/2006 |
| KR | 20070013002 A | 1/2007 |
| KR | 20100052926 A | 5/2010 |
| WO | 9828767 A1 | 7/1998 |
| WO | 1999026299 A1 | 5/1999 |
| WO | 2003050329 A2 | 6/2003 |
| WO | 03084292 A1 | 10/2003 |
| WO | 2005001889 A2 | 1/2005 |
| WO | 2005002007 A2 | 1/2005 |
| WO | 2005031802 A2 | 4/2005 |
| WO | 2005052996 A2 | 6/2005 |
| WO | 2005067524 A2 | 7/2005 |
| WO | 2005086782 A3 | 9/2005 |
| WO | 2006027778 A2 | 3/2006 |
| WO | 2006088877 A1 | 8/2006 |
| WO | 2006098540 A1 | 9/2006 |
| WO | 2007037882 A1 | 4/2007 |
| WO | 2007095173 A2 | 8/2007 |
| WO | 2007117672 A2 | 10/2007 |
| WO | 2007143197 A2 | 12/2007 |
| WO | 2007143197 A3 | 12/2007 |
| WO | 2008007124 A1 | 1/2008 |
| WO | 2008021962 A2 | 2/2008 |
| WO | 2008021962 A3 | 2/2008 |
| WO | 2008063652 A1 | 5/2008 |
| WO | 2008063653 A1 | 5/2008 |
| WO | 2008063657 A2 | 5/2008 |

(56) References Cited

FOREIGN PATENT DOCUMENTS

| WO | 2008063657 A3 | 5/2008 |
|---|---|---|
| WO | 2008063658 A2 | 5/2008 |
| WO | 2008063658 A3 | 5/2008 |
| WO | 2008073373 A1 | 6/2008 |
| WO | 2009123763 A2 | 10/2009 |
| WO | 2009123763 A3 | 12/2009 |
| WO | 2011005859 A2 | 1/2011 |
| WO | 2012138409 A2 | 10/2012 |
| WO | 2012158252 A1 | 11/2012 |

OTHER PUBLICATIONS

Adachi, C., et al., "High-efficiency red electrophosphorescence devices," Applied Physics Letters, vol. 78, No. 11, Mar. 12, 2001, pp. 1622-1624.
Allen, M.W., et al., "Bulk transport measurements in ZnO: The effect of surface electron layers," Physical Review B, 81, 2010, 075211-1-075211-6.
Anikeeva, P.O., et al., "Photoluminescence of CdSe/ZnS core/shell quantum dots enhanced by energy transfer from a phosphorescent donor," Chemical Physics. Letters, vol. 424, 2006, pp. 120-125.
Arango, A.C., Thesis entitled "A Quantum Dot Heterojunction Photodetector," Submitted to the Department of Electrical Engineering and Computer Science at the Massachusetts Institute of Technology, Feb. 2005, 117 pages.
Bae, W.K., et al., "Multicolored Light-Emitting Diodes Based on All-Quantum-Dot Multilayer Films Using Layer-by-Layer Assembly Method," Nano Lett., 2010, 10, pp. 2368-2373.
Bailey, R.E, et al., "Alloyed Semiconductor Quantum Dots: Tuning the Optical Properties Without Changing the Particle Size," J. Am. Chem. Soc., vol. 125, No. 23, 2003, pp. 7100-7106.
Bera, D., et al., "Quantum Dots and Their Multimodal Applications: A Review," Materials 2010, 3, pp. 2260-2345.
Blochwitz, J., et al., "Interface electronic structure of organic semiconductors with controlled doping levels," Organic Electronics 2, 2001, pp. 97-104.
Bolink, H.J., et al., "Efficient Polymer Light-Emitting Diode Using Air-Stable Metal Oxides as Electrodes," Adv. Mater., 20, 2008, pp. 1-4.
Bulovic, V., et al., "Molecular Organic Light-Emitting Devices," Electroluminescence I, Semiconductors and Semimetals, vol. 64, 2000, p. 255-307.
Bulovic, V., et al., "Transparent light-emitting devices," Nature, vol. 380, Mar. 7, 1996, p. 29.
Cao, Y-W, et al., "Growth and Properties of Semiconductor Core/Shell Nanocrystals with InAs Cores," J. Am. Chem. Soc., vol. 122, No. 40, 2000, pp. 9692-9702.
Carlson, B., et al., "Valence Band Alignment at Cadmium Selenide Quantum Dot and Zinc Oxide (1010) Interfaces," J. Phys. Chem. C, 2008, 112, pp. 8419-8423.
Carter, S.A., et al., "Enhanced luminance in polymer composite light emitting devices," Appl. Phys. Lett., vol. 71 (9), Sep. 1997, pp. 1145-1147.
Caruge, J.M., et al., "Colloidal quantum-dot light-emitting diodes with metal-oxide charge transport layers," Nature Publishing Group, published online Mar. 16, 2008, Nature Photonics, vol. 2, Apr. 2008, pp. 247-250.
Caruge, J-M, et al., "NiO as an Inorganic Hole-Transporting Layer in Quantum-Dot Light-Emitting Devices," Nano Letters, 2006, vol. 6, No. 12, pp. 2991-2994.
Chan, C., et al., "Contact potential difference measurements of doped organic molecular thin films," J. Vac. Sci. Technol. A, 22(4), Jul./Aug. 2004, pp. 1488-1492.
Chan, I-M, et al., "Improved performance of the single-layer and double-layer organic light emitting diodes by nickel oxide coated indium tim oxide anode," Thin Solid Films, 450, 2004, pp. 304-311.
Chen, H-S, et al., "Colloidal ZnSe, ZnSe/ZnS, and ZnSe/ZnSeS Quantum Dots Synthesized from ZnO," J. Phys. Chem. B, vol. 108, No. 44, 2004, pp. 17119-17123.

Cherniavskaya, O., et al., "Photoionization of Individual CdSe/CdS Core/Shell Nanocrystals on Silicon with 2-nm Oxide Depends on Surface Band Bending," Nano Letters, vol. 3, No. 4, 2003, pp. 497-501.
Chittofrati, A, et al., "Uniform Particles of Zinc Oxide of Different Morphologies," Colloids and Surfaces 48, 1990, pp. 65-78.
Cho, K-S, et al., "High-performance crosslinked colloidal quantum-dot light-emitting diodes," Nature Photonics, Advance Online Publication, published online May 24, 2009, DOI: 10.1038/NPHOTON2009.92, pp. 1-5.
Cizeron, et al., "Solid Solution of CdyZn1-yS Nanosized Particles: Photophysical Properties", J. Phys. Chem. B, vol. 101, No. 44, 1997, pp. 8887-8891.
Coe, S., et al., "Electroluminescence from single monolayers of nanocrystals in molecular organic devices," Nature Publishing Group, Nature, vol. 420, 19, Dec. 26, 2002, pp. 800-803.
Coe-Sullivan, S., "The Application of Quantum Dots in Display Technology," Material Matters, vol. 2, No. 1, 2007, pp. 13-14.
Coe-Sullivan, S., et al., "Large-Area Ordered Quantum-Dot Monolayers via Phase Separation During Spin-Casting," Adv. Funct. Mater., 2005; vol. 15, pp. 1117-1124.
Coe-Sullivan, S., et al., "Method for fabrication of saturated RGB quantum dot light emitting devices," Light Emitting Diodes: Research, Manufacturing, and Applications IX, Proc. of SPIE, vol. 5739, pp. 108-115, 2005.
Coe-Sullivan, S., et al., "Tuning the performance of hybrid organic/inorganic quantum dot light-emitting devices," Organic Electronics, 4, 2003, pp. 123-130.
Coe-Sullivan, S., Thesis entitled "Hybrid Organic/Quantum Dot Thin Film Structures and Devices", Submitted to the Department of Electrical Engineering and Computer Science at the Massachusetts Institute of Technology, Jun. 2005, 169 pages.
Dabbousi, B.O., et al., "(CdSe)ZnS Core-Shell Quantum Dots: Synthesis and Characterization of a Size Series of Highly Luminescent Nanocrystallites," J. Phys. Chem B., 1997, 101, pp. 9463-9475.
D'Andrade, B., et al., "Bright White Electrophosphorescent Triple-Emissive Layer Oranic Light Emitting Device," Abstract on p. 3, Symposium BB, Organic Optoelectronic Materials, Processing, and Devices, Session BB6.2, Nov. 25-30, 2001.
Decision of Rejection in Chinese Patent Application No. 200980120363.6, dated Feb. 6, 2015, with English translation, 15 pages.
Dirr, S., et al., "Organic Light Emitting Diodes with Reduced Spectral and Spacial Halfwidths," Jpn. J. Appl. Phys., vol. 37, Pt. 1, No. 3B, 1998, pp. 1457-1461.
Donega, C., et al., "Single-Step Synthesis to Control the Photoluminescence Quantum Yield and Size Dispersion of CdSe Nanocrystals," J. Phys. Chem. B, vol. 107, No. 2, 2003, pp. 489-496.
Eason, D.B., et al., "High-brightness blue and green light-emitting diodes," Appl. Phys. Lett., vol. 66, No. 2, Jan. 9, 1995, pp. 115-117.
Empedocles, S.A., et al., "Photoluminescence Spectroscopy of Single CdSe Nanocrystallite Quantum Dots," Physical Review Letters, vol. 77, No. 18, Oct. 28, 1996, pp. 3873-3876.
European Office Action dated Jul. 12, 2012, in European Patent Application No. 09727880.8, 5 pages.
European Supplemental Search Report dated Jul. 22, 2011, in European Patent Application No. 09727880.8, 9 pages.
Fifth Chinese Office Action dated Jul. 25, 2014, in Chinese Patent Application No. 200980120363.6, with English translation, 7 pages.
Final Office Action for U.S. Appl. No. 12/454,705, filed May 21, 2009; dated Aug. 27, 2013; 14 pages.
First Chinese Office Action dated Apr. 14, 2017, in Chinese Patent Application No. 201610206693.9, with English translation, 18 pages.
First Chinese Office Action dated Dec. 7, 2011, in Chinese Patent Application No. 200980120363.6, with English translation, 7 pages.
Forrest, S., et al., "Measuring the Efficiency of Organic Light-Emitting Diodes," Adv. Mater., vol. 15, No. 13, Jul. 4, 2003, pp. 1043-1048.
Fourth Chinese Office Action dated Dec. 26, 2013, in Chinese Patent Application No. 200980120361.6, with English translation, 21 pages.

(56) References Cited

OTHER PUBLICATIONS

Gu, G., et al., "Transparent organic light emitting devices," Appl. Phys. Lett., vol. 68, Issue 19, May 6, 1996, pp. 2606-2608.

Harrison, M.T., et al., "Wet chemical synthesis and spectroscopic study of CdhgTe nanocrystals with strong near-infrared luminescence," Materials Science and Engineering, B69-70, 2000, pp. 355-360.

Hines M.A., et al., "Synthesis and Characterization of Strongly Luminescing ZnS-Capped CdSe Nanocrystals," J. Phys. Chem., vol. 100, No. 2, 1996, pp. 468-471.

Hines, M.A., et al., "Bright UV-Blue Luminescent Colloidal ZnSe Nanocrystals," The Journal of Physical Chemistry B, vol. 102, No. 19, May 7, 1998, pp. 3655-3657.

Hoyer, P., et al., "Potential-Dependent Electron Injection in Nanoporous Colloidal ZnO Films," J. Phys. Chem., vol. 99, No. 38, 1995, pp. 14096-14100.

Huang, H., et al., "Bias-Induced Photoluminescence Quenching of Single Collodidal Quantum Dots Embedded in Organic Semiconductors," Nano Letters, vol. 7, No. 12, 2007, pp. 3781-3786.

Ichikawa, M., et al., "Bipyridyl oxadiazoles as efficient and durable electron-transporting and hole-blocking molecuar materials," J. Mater. Chem., 2006, 16, pp. 221-225.

International Search Report for International Application No. PCT/US2009/02123; International Filing Date Apr. 3, 2009; dated Aug. 21, 2009; 5 pages.

Ivanov, S.A., et al., "Light Amplification Using Inverted Core/Shell Nanocrystals: Towards Lasing in the Single-Exciton Regime," J. Phys. Chem. B, vol. 108, No. 30, 2004, pp. 10625-10630.

Jang, E., et al., "High quality CdSeS nanocrystals synthesized by facile single injection process and their electroluminescence," Chem. Commun., 2003, pp. 2964-2965.

Jasieniak, J., et al., "Size-Dependent Valence and Conduction Band-Edge Energies of Semiconductor Nanocrystals," ACS Nano, vol. 5, No. 7, pp. 5888-5902, 2011.

Jiang, W., et al., "Optimizing the Synthesis of Red-to Near-IR-Emitting CdS-Capped CdTexSe1-x Alloyed Quantum Dots for Biomedical Imaging," Chem. Mater., vol. 18, No. 20, 2006, pp. 4845,4854.

Jun S. et al., "Interfused semiconductor nanocrystals: brilliant blue photoluminescence and electroluminescence," Chem. Commun., 2005, pp. 4616-4618.

Kim, H-M, et al., "Semi-transparent quantum-dot light emitting diodes with an inverted structure," J. Mater. Chem. C, 2014, 2, 2259-2265.

Kim, S-W, et al., "Engineering InAsxP1-x/InP/ZnSe III-V Alloyed Core/Shell Quantum Dots for the Near-Infrared," J. Am. Chem. Soc., vol. 127, No. 30, 2005, pp. 10526-10532.

Korean Notice of Final Rejection dated Dec. 23, 2015, in Korean Patent Application No. 10-20107024680, with English translation, 6 pages.

Korean Notice of Final Rejection dated May 29, 2017, in Korean Patent Application No. 10-2016-7010666, with English translation, 6 pages.

Korean Notice of Preliminary Rejection dated Aug. 16, 2016, in Korean Patent Application No. 10-2016-7010666, with English translation, 9 pages.

Korean Notice of Preliminary Rejection dated Feb. 3, 2015, in Korean Patent Application No. 10-20107024680, with English translation, 9 pages.

Korean Notice of Preliminary Rejection dated May 23, 2016, in Korean Patent Application No. 10-2010-7024680, with English translation, 9 pages.

Korgel, B.A., et al., "Controlled Synthesis of Mixed Core and Layered (Zn,Cd)S and (Hg,Cd)S Nanocrystals within Phosphatidylcholine Vesicles," Langmuir, vol. 16, No. 8, 2000, pp. 3588-3594.

Kwak, J., et al., "Bright and Efficient Full-Color Colloidal Quantum Dot Light-Emitting Diodes Using an Inverted Device Structure," Nano Lett., 2012, 12, (5), pp. 2362-2366.

Kwak, J. et al., Supporting Information (12 pages) for "Bright and Efficient Full-Color Colloidal Quantum Dot Light-Emitting Diodes Using an Inverted Device Structure," Nano Lett., 2012, 12, (5), pp. 2362-2366.

Kwon, S-J, et al., "Soft-chemistry Route to P-I-N Heterostructured Quantum Dot Electroluminescence Device: All Solution-Processed Polymer-Inorganic Hybrid QD-EL Device," Mater. Res. Soc. Symp. Proc., vol. 959, 2007, 5 pages.

Lai J.H. et al., "Stabilization of ZnO polar plane with charged surface nanodefects," Physical Review B, 82, 2010, pp. 155406-1-155406-5.

Lee, C. et al., "Full-color light-emitting diodes based on colloidal quantum dots," 218th ECS Meeting, Abstract #1590, 2010, 1 page.

Lee, D. et al., "Demonstration of Full Color and White Quantum Dot Light-Emitting Diodes with a Simple Inverted Structure," undated, from internet, 59 pages, filed with IDS dated Aug. 16, 2016 in U.S. Appl. No. 12/896,856.

Lee, W.Y. et al., "High-current-density ITOx/NiOx thin-film diodes," Applied Physics Letters, vol. 72, No. 13, Mar. 30, 1998, pp. 1584-1586.

Lee, Y-L, et al., "Highly Efficient Quantum-Dot-Sensitized Solar Cell Based on Co-Sensitization of CdS/CdSe," Adv. Funct. Mater., 2009, vol. 19, pp. 604-609.

Li et al., "High Quality ZnSe and ZnS Nanocrystals Formed by Activating Zinc Carboxylate Precursors", Nano Letters, 2004, vol. 4, No. 11, 2261-2264.

Li, S., et al., "Surface States in the Photoionization of High-Quality CdSe Core/Shell Nanocrystals," ACS Nano. vol. 3, No. 5, 2009, pp. 1267-1273.

Lim, J., et al., "Preparation of Highly Luminescent Nanocrystals and Their Application to Light-Emitting Diodes," Adv. Mater., 19, 2007, pp. 1927-1932.

Lin, X.M. et al., "Formation of Long-Range-Ordered Nanocrystal Superlattices on Silicon Nitride Substrates," J. Phys. Chem. B, vol. 105, No. 17, 2001, pp. 3353-3357.

Lipovskii, A., et al., "Synthesis and characterization of PbSe quantum dots in phosphate glass," Appl. Phys. Lett., vol. 71, No. 23, Dec. 8, 1997, pp. 3406-3408.

Liu, H., et al., "Mechanistic Study of Precursor Evolution in Colloidal Group II-VI Semiconductor Nanocrystal Synthesis," J. Am. Chem. Soc., vol. 129, No. 2, 2007, pp. 305-312.

Luther, B.P., et al., "Analysis of a thin AlN interfacial layer in Ti/Al and Pd/Al ohmic contacts to n-type GaN," Appl. Phys. Lett., vol. 71, No. 26, Dec. 29, 1997, pp. 3859-3861.

Mahler, B., et al., "Towards non-blinking colloidal quantum dots," Nature Materials, vol. 7, Aug. 2008, pp. 659-664.

Mashford, B., et al., "All-inorganic quantum-dot light-emitting devices formed via low-cost, wet-chemical processing," J. Mater. Chem., 2010, 20, pp. 167-172.

Mashford, B., et al., "High-efficiency quantum-dot light-emitting devices with enhanced charge injection," Nature Photonics, vol. 7, May 2013, pp. 407-412.

Matijevic, E., "Preparation and characterization of monodispersed metal hydrous oxide sols," Progr. Colloid & Polymer Sci., vol. 61, pp. 24-35 (1976).

Miller, J.B., et al., "Microstructural evolution of sol-gel derived ZnO thin films," Thin Solid Films, 518, 2010, pp. 6792-6798.

Moeller, G., et al., "Quantum-Dot Light-Emitting Devices for Displays," OLED materials, Information Display, Feb. 2006, pp. 2-6.

Murray, C.B., "Synthesis and Characterization of II-VI Quantum Dots and Their Assembly into 3D Quantum Dot Superlattices," Thesis submitted to the Department of Chemistry at the Massachusetts Institute of Technology, Sep. 1995, 166 pages.

Murray, C.B., et al., "Synthesis and Characterization of Monodisperse Nanocrystals and Close-Packed Nanocrystal Assemblies," Annu. ev. Mater. Sci., 2000, 30, pp. 545-610.

Hurray, C.B., et al., "Synthesis and Characterization of Nearly Monodisperse CdE (E=S, Se, Te) Semiconductor Nanocrystallites," J. Am. Chem. Soc., vol. 115, No. 19, 1993, pp. 8706-8715.

Nayak, M., et al., "Passivation of CdTe Nanoparticles by Silane Coupling Agent Assisted Silica Encapsulation," 26th Annual Conf.

(56) References Cited

OTHER PUBLICATIONS on Composites, Advanced Ceramics, Materials, and Structures: B: Ceramic Eng. and Sci. Proceedings, 2008, vol. 23, Issue 4.
Non-Final Office Action for U.S. Appl. No. 12/454,705, filed May 21, 2009; dated Mar. 25, 2014; 14 pages.
Non-Final Office Action for U.S. Appl. No. 13/441,394, filed Apr. 6, 2012; dated Dec. 15, 2015; 15 pages.
Oertel, D.C., et al., Photodetectors based on treated CdSe quantum-dot films, Applied Physics Letters, 2005, vol. 87, pp. 213505-1-213505-3.
Ohmori, Y., et al., "Photovoltaic properties of phthalocyanine based p-n diode evaporated onto titanium dioxide," Thin Solid Films, 2006, vol. 499, pp. 369-373.
Park, Ji Sun, et al., "Efficient hybrid organic-inorganic light emitting diodes with self-assembled dipole molecule deposited metal oxides", Appl. Phys. Lett. 96 (2010) 243306 (1-3).
PCT Search Report and Written Opinion for International Application PCT/US10/051867, dated Dec. 9, 2010, 16 pages.
PCT Search Report for International Application PCT/US2007/024310, dated May 27, 2008, 4 pages.
Petrov, D.V., et al., "Size and Band-Gap Dependences of the First Hyperpolarizability of $CdxZn1-xS$ Nanocrystals," J. Phys. Chem. B, vol. 106, No. 21, 2002, pp. 5325-5334.
Protiere, M., et al., "Highly Luminescent $Cd1-xZnxSe/ZnS$ Core/Shell Nanocrystals Emitting in the Blue-Green Spectral Range," Luminescent Materials, Small, 2007, 3, No. 3, pp. 399-403.
Qian, L., et al., "Electroluminescence from light-emitting polymer/ZnO nanoparticle heterojunctions at sub-bandgap voltages," Nano Today, 2010, 5, pp. 384-389.
Qu, L., et al., "Control of Photoluminescence Properties of CdSe Nanocrystals in Growth," J. Am. Chem. Soc., vol. 124, No. 9, 2002, pp. 2049-2055.
Salafsky, J.S., "Exciton dissociation, charge transport, and recombination in ultrathin, conjugated polymer-$TiO_2$ nanocrystal intermixed composites," Physical Review B, vol. 59, No. 16, Apr. 15, 1999, pp. 885-894.
Santhanam, V., et al., "Self-Assembly of Uniform Monolayer Arrays of Nanoparticles," Langmuir, vol. 19, No. 19, 2003, pp. 7881-7887.
Sato, H., et al., "Transparent conducting p-type NiO thin films prepared by magnetron sputtering," Thin Solid Films, 236, 1993, pp. 27-31.
Schlamp, M.C., et al., "Improved efficiencies in light emitting diodes made with CdSe(CdS) core/shell type nanocrystals and a semiconducting polymer," J. Appl. Phys., vol. 82, No. 11, Dec. 1, 1997, pp. 5837-5482.
Schmechel, R., "A theoretical approach to the hopping transport in p-doped zinc-phthalocyanine," 48, Internationales Wissenschaftliches Kolloquium, Technische Universtaat Ilmenau, Sep. 22-25, 2003, 2 pages.
Second Chinese Office Action dated Oct. 30, 2012, in Chinese Patent Application No. 200980120363.6, with English translation, 23 pages.
Seedorf, T., et al., "Comparative study of molecular beam and migration-enhanced epitaxy of ZnCdSe quantum wells: influence on interface and composition fluctuations," Journal of Crystal Growth, 214/215, 2000, pp. 602-605.
Shan, et al., "Growth and evolution of ZnCdSe quantum dots", J. Vac. Sci. Technol. B, 20 (3), May/Jun. 2002, pp. 1102-1106.
Shin, et al., "Thotoluminescence of $ZnSexTe1-s/ZnTe$ multiple-quantum-well structures grown by molecular-beam epitaxy", Journal of Applied Physics, 2004, vol. 96, No. 12, 7267-7271.
Sixth Chinese Office Action dated Jul. 17, 2015, in Chinese Patent Application No. 200980120363.6, with English translation, 6 pages.
Steckel, et al., "1.3 um to 1.55 um Tunable Electronluminescence from PbSe Quantum Dots Embedded within an Organic Device", Advanced Materials, vol. 15, No. 21, (2003), 1862-1866.
Steckel, et al., "Color-Saturated Green-Emitting QD-LEDs", Angew. Chem. Int. Ed., 2006, vol. 45, 5796-5799.
Steckel, J.S., et al., "Blue Luminescence from (CdS)ZnS Core-Shell Nanocrystals," Angew. Chem. Int. Ed., 2004, 43, pp. 2154-2158.

Steckel, J.S., Thesis entitled "The Synthesis of Inorganic Semiconductor Nanocrystalline Materials for the Purpose of Creating Hybrid Organic/Inorganic Light-Emitting Devices," Submitted to the Dept. of Chemistry at MIT, Feb. 2006, 213 pages.
Stossel, M., et al., "Impact of the cathode metal work function on the performance of vacuum-deposited organic light emitting-devices," Appl. Phys. A, Apr. 1999, vol. 68, Issue 4, pp. 387-390.
Stouwdam, J.W., et al., "Red, green, and blue quantum dot LEDs with solution processable ZnO nanocrystal electron injection layers," Journal of Materials Chemistry, 2008, vol. 18, pp. 1889-1894, published online Mar. 5, 2008.
Suga, K., et al., "Gas-sensing characteristics of ZnO-NiO junction structures with intervening ultrathin $SiO_2$ layer," Sensors and Actuators B, 13-14, 1993, pp. 598-599.
Supran, et al., "QLEDs for displays and sold-state lighting", MRS Bulletin, vol. 38 (2013), pp. 703-711.
Talapin, D., et al., "Prospects of Colloidal Nanocrystals for Electronic and Optoelectronic Applications," Chem. Reviews, 2010, vol. 110, pp. 389-458.
Talapin, et al., "Highly Luminescent Monodisperse CdSe and CdSe/ZnS Nanocrystals Synthesized in a Hexadecylamine-Trioctylphosphine Oxide-Trioctylphospine Mixture", Nano Letters, 2001, vol. 1, No. 4; pp. 207-211.
Third Chinese Office Action dated Jun. 3, 2013, in Chinese Patent Application No. 200980120363.6, with English translation, 15 pages.
United States Statutory Invention Registration, Registration No. H429, Publsihed Feb. 2, 1988, to Harris et al., 4 pages.
Van Dijken, A., et al., "Influence of Adsorbed Oxygen on the Emission Properties of Nanocrystalline ZnO Particles," J. Phys. Chem. B, vol. 104, No. 18, 2000, pp. 4355-4360.
Vogel, R., et al., "Quantum-Sized PbS, CdS, $Ag_2S$, $Sb_2S_2$ and $Bi_2S_3$ Particles as Sensitizers for Various Nanoporous Wide-Bandgap Semiconductors," The Journal of Physical Chemistry, vol. 98, No. 12, 1994, pp. 3183-3188.
Wang et al., "Room-Temperature Synthesis and Characterization of Nanocrystalline CdS, ZnS, and $CdxZn1-xS$", Chem. Mater. 2002, vol. 14, 3028-3033.
Woo, W-K, et al., "Reversible Charging of CdSe Nanocrystals in a Simple Solid-State Device," Advanced Materials, 2002, vol. 14, No. 15, Aug. 5, pp. 1068-1071.
Wood, V., et al., "Efficient All-Inorganic Colloidal Quantum Dot LEDs," Optical Soc. of America, conference paper from Conference on Lasers and Electro Optics, Baltimore, MD, May 6, 2007, 2 pages.
Wood, V., et al., "Selection of Metal Oxide Charge Transport Layers for Colloidal Quantum Dot LEDs," ACS Nano, 2009, vol. 3, No. 11, pp. 3581-3586.
Wu, X., et al., "Charge-transfer processes in single CdSe/ZnS quantum dots with p-type NiO nanoparticles," Chem. Commun., 46, 2010, pp. 4390-4392.
Xie, et al., "Preparation and Characterization of Overcoated II-VI Quatum Dots", J. Nanosci. and Nanotech., vol. 5, No. 6, Jun. 2005, pp. 880-886.
Xie, et al., "Synthesis and Characterization of Highly Luminescent CdSe-Core $CdS/Zn0.5Cd0.5S/ZnS$ Multishell Nanocrystals", J. Amer. Chem. Soc., 2005, vol. 127, 7480-7488.
Xing, et al., "Bioconjugated quantum dots for multiplexed and quantitative immunohistochemistry", Nature Protocols, 2007, vol. 2, No. 5, 1152-1165.
Xu, Y., et al., "The absolute energy positions of conduction and valence bands of selected semiconducting minerals," American Mineralogist, vol. 85, pp. 543-556, 2000.
Yamasaki, et al., "Organic light-emitting device with an ordered monolayer of silica microspheres as a scattering medium", Applied Physics Letters, vol. 76, No. 10, pp. 1243-1245 (2000).
Yoshida, T., et al., "A New Near-Infrared-Light Emitting Diode of Monodispersed Nanocrystallite Silicon," International Electron Devices Meeting 2001, IEDM, Technical Digest, IEEE, Dec. 2, 2001, pp. 175-178.
Yu et al., "Formation of High-Quality CdS and Other II-VI Semiconductor Nanocrystals in Noncoordinating Solvents: Tunable Reactivity of Monomers", Agnew Chem. Int. Ed., 2002, 41 No. 13, 2368-2371.

(56) References Cited

OTHER PUBLICATIONS

Zhong, et al., "Alloyed ZnxCd1-xS Nanocrystals with Highly Narrow Luminescence Spectral Width", J. Am. Chem. Soc. 2003, vol. 125, 13559-13563.

Zhong, et al., "Composition-Tunable ZnxCd1-xSe Nanocrystals with High Luminescence and Stability", J. Am. Chem. Soc., 2003, vol. 125, 8589-8594.

Zhong, et al., "Embryonic Nuclei-Induced Alloying Process for Reproducible Synthesis of Blue-Emitting ZnxCd1-xSe Nanocrystals with Long-Time Thermal Stability in Size Distribution and Emission Wavelength", J. Phys. Chem. B, 2004, 108, 1552-15559.

Zhong, et al., "High-Quality Violet-to Red-Emitting ZnSe/CdSe Core/Shell Nanocrystals", Chem. Mater. 2005, vol. 17, 4038-4042.

\* cited by examiner

Luminance And External Quantum Efficiencies

FIG. 5
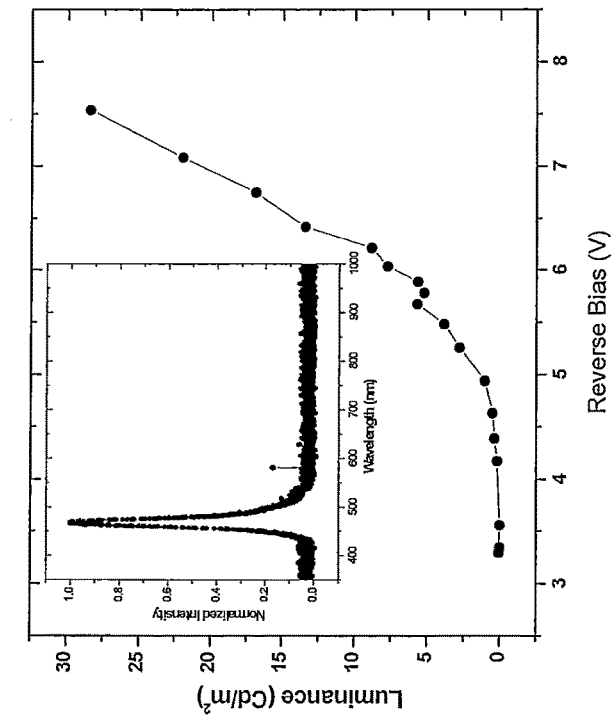
(B) For Device including emissive material including blue-emitting semiconductor nanocrystals
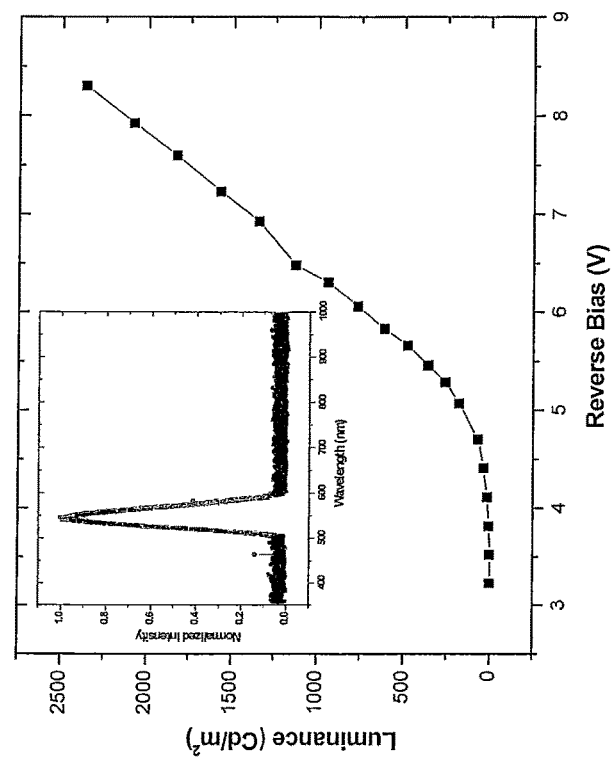
(A) For device including emissive material including green-emitting semiconductor nanocrystals

LIGHT-EMITTING DEVICE INCLUDING QUANTUM DOTS

This application is a continuation of U.S. application Ser. No. 12/896,856, filed 2 Oct. 2010, which is a continuation of commonly owned International Application No. PCT/US2009/002123 filed 3 Apr. 2009, which was published in the English language as PCT Publication No. WO2009/123763 on 8 Oct. 2009, which International Application claims priority to U.S. Application No. 61/042,154 filed 3 Apr. 2008, each of the foregoing hereby being incorporated herein by reference in its entirety.

FEDERALLY SPONSORED RESEARCH OR DEVELOPMENT

This invention was made with Government support under Advanced Technology Program Award No. 70NANB7H7056 awarded by NIST. The United States has certain rights in the invention.

TECHNICAL FIELD OF THE INVENTION

The present invention relates to the technical field of devices including quantum dots.

SUMMARY OF THE INVENTION

In accordance with one aspect of the present invention there is provided a light emitting device including a cathode, a layer comprising a material capable of transporting and injecting electrons comprising an inorganic material, an emissive layer comprising quantum dots, a layer comprising a material capable of transporting holes, a hole injection material, and an anode.

In certain embodiments, a light emitting device includes a cathode and an anode, and an emissive layer comprising quantum dots provided between the cathode and the anode, and wherein the device further includes: a layer comprising material capable of transporting and injecting electrons provided between the cathode and the emissive layer, a layer comprising material capable of transporting holes provided between the emissive layer and the anode, and a layer comprising a hole-injection material provided between the anode and the layer comprising material capable of transporting holes, wherein the material capable of transporting and injecting electrons comprises an inorganic material and the material capable of transporting holes comprises an organic material.

In certain embodiments, the material capable of transporting and injecting electrons comprises an inorganic that is doped with a species to enhance electron transport characteristics of the inorganic material.

In certain embodiments, the material capable of transporting and injecting electrons comprises an inorganic semiconductor material.

In certain embodiments, the material capable of transporting and injecting electrons comprises a metal chalcogenide. In certain embodiments, the inorganic material comprises a metal sulfide. In certain preferred embodiments, the material capable of transporting and injecting electrons comprises a metal oxide.

In certain embodiments, the inorganic material comprises titanium dioxide.

In certain more preferred embodiments, the inorganic material comprises zinc oxide.

In certain embodiments, the inorganic material comprises a mixture of two or more inorganic materials.

In certain preferred embodiments, the inorganic material comprises a mixture of zinc oxide and titanium oxide.

In certain embodiments, the layers are formed in the following sequential order: the cathode, the layer comprising a material capable of transporting and injecting electrons comprising an inorganic material, the emissive layer comprising quantum dots, the layer comprising a material capable of transporting holes comprising an organic material, the layer comprising a hole injection material, and the anode.

In certain embodiments, the layer comprising a material capable of transporting and injecting electrons comprises a stratified structure including two or more horizontal zones having different conductivities. In certain embodiments, the stratified structure includes a first zone, on a side of the structure closer to the cathode, comprising an n-type doped material with electron injecting characteristics, and a second zone, on the side of the structure closer to the emissive layer, comprising an intrinsic or lightly doped material with electron transport characteristics. In certain embodiments, for example, the first zone can comprise n-type doped zinc oxide and the second zone can comprise intrinsic zinc oxide or n-type doped zinc oxide with a lower n-type dopant concentration that that of the zinc oxide in the first zone. In certain embodiments, for example, the stratified structure can include a first zone, on a side of the structure closer to the cathode, comprising an n-type doped material with electron injecting characteristics, a third zone, on a side of the structure closer to the emissive layer, comprising an intrinsic material with hole blocking characteristics, and a second zone, between the first and third zones, comprising an intrinsic or lightly doped material with electron transport characteristics. In certain embodiments, for example, the layer comprising a material capable of transporting and injecting electrons can comprise a first layer, closer to the cathode, comprising a material capable of injecting electrons and a second layer, closer to the emissive layer, comprising a material capable of transporting electrons. In certain embodiments, for example, the layer comprising a material capable of transporting and injecting electrons can comprise a first layer, closer to the cathode, comprising a material capable of injecting electrons, a second layer, closer to the emissive layer, comprising a material capable of blocking holes, and a third layer between the first and second layers, comprising a material capable of transporting electrons.

In certain embodiments, the device can further include a spacer layer between the emissive layer and an adjacent layer included in the device (e.g., a layer comprising a material capable of transporting holes and/or a layer comprising a material capable of transporting and injecting electrons).

A spacer layer can comprise an inorganic material. A spacer layer can comprise an organic material. Additional information concerning a spacer layer is provided below.

In certain preferred embodiments, a spacer layer comprises a material non-quenching to quantum dot emission.

In certain embodiments, the hole injection material can comprise a material capable of transporting holes that is p-type doped.

In certain embodiments, the absolute value of the difference between $E_{LUMO}$ of the quantum dots and the Work function of the Cathode is less than 0.5 eV. In certain embodiments, the absolute value of the difference between $E_{LUMO}$ of the quantum dots and the Work function of the Cathode is less than 0.3 eV. In certain embodiments, the absolute value of the difference between $E_{LUMO}$ of the quantum dots and the Work function of the Cathode is less than 0.2 eV.

In certain embodiments, the absolute value of the difference between $E_{LUMO}$ of the quantum dots and $E_{conduction\ band\ edge}$ of the material capable of transporting & injecting electrons is less than 0.5 eV. In certain embodiments, the absolute value of the difference between $E_{LUMO}$ of the quantum dots and $E_{conduction\ band\ edge}$ of material capable of transporting & injecting electrons is less than 0.3 eV. In certain embodiments, the absolute value of the difference between $E_{LUMO}$ of the quantum dots and E conduction band edge of material capable of transporting & injecting electrons is less than 0.2 eV.

In certain embodiments, the absolute value of the difference between $E_{HOMO}$ of the quantum dots and the $E_{VALENCE\ band\ edge}$ of the material capable of transporting and injecting electrons is greater than about 1 eV. In certain embodiments, the absolute value of the difference between $E_{HOMO}$ of the quantum dots and the $E_{VALENCE\ band\ edge}$ of the material capable of transporting and injecting electrons is greater than about 0.5 eV. In certain embodiments, the absolute value of the difference between $E_{HOMO}$ of the quantum dots and the $E_{VALENCE\ band\ edge}$ of the material capable of transporting and injecting electrons is greater than about 0.3 eV.

In certain embodiments, the device can have an initial turn-on voltage that is not greater than 1240/λ, wherein λ represents the wavelength (nm) of light emitted by the emissive layer.

In certain embodiments, light emission from the light emissive material occurs at a bias across the device that is less than the electron-Volt of the bandgap of the quantum dots in the emissive layer.

In certain embodiments, quantum dots can include a core comprising a first material and a shell disposed over at least a portion of, and preferably substantially all, of the outer surface of the core, the shell comprising a second material. (A quantum dot including a core and shell is also described herein as having a core/shell structure.) In certain embodiments, more than one shell can be included in the core. In certain embodiments, the first material comprises an inorganic semiconductor material. In certain embodiments, the second material comprises an inorganic semiconductor material.

In certain embodiments, quantum dots comprise inorganic semiconductor nanocrystals. In certain embodiments, inorganic semiconductor nanocrystals can comprise a core/shell structure. In certain preferred embodiments, quantum dots comprise colloidally grown inorganic semiconductor nanocrystals.

In certain embodiments, at least a portion of the quantum dots include a ligand attached to an outer surface thereof. In certain embodiments, two or more chemically distinct ligands can be attached to an outer surface of at least a portion of the quantum dots. In certain embodiments, an anode comprising a material with <5 eV work function can be used, thereby avoiding the need to utilize precious metals such as gold, etc.

In accordance with another aspect of the present invention, there is provided a method for preparing a light emitting device, the method comprising:

forming a layer comprising a material capable of transporting and injecting electrons on a cathode, wherein the material capable of transporting and injecting electrons comprises an inorganic material;

applying an emissive layer comprising quantum dots thereover;

forming a layer comprising a material capable of transporting holes comprising an organic material over the emissive layer;

forming a layer comprising a hole injection material over the layer comprising a material capable of transporting holes; and forming an anode over the layer comprising a hole injection material.

In certain embodiments, the method further comprises encapsulating the light emitting device.

In accordance with another aspect of the present invention, there is provided a light emitting device including a pair of electrodes, a layer comprising a light emissive material comprising quantum dots provided between the electrodes, and a layer comprising a material capable of transporting electrons comprising an inorganic material provided between the emissive layer and one of the electrodes, wherein the layer comprising the material capable of transporting electrons comprising an inorganic material comprises a stratified structure including two or more horizontal zones having different conductivities. The inorganic material included in different zones of the stratified structure can be doped or undoped forms of the same or different materials.

In certain embodiments, the electron and hole populations are balanced at the emissive layer of the device.

In certain embodiments, the inorganic material comprises an inorganic semiconductor material.

In certain preferred embodiments, the inorganic material comprises a metal chalcogenide. In certain embodiments, the inorganic material comprises a metal sulfide. In certain preferred embodiments, the inorganic material comprises a metal oxide. In certain embodiments, the inorganic material comprises titanium dioxide.

In certain more preferred embodiments, the inorganic material comprises zinc oxide. In certain embodiments, the zinc oxide is surface treated with an oxidizing agent to render the surface proximate to the emissive layer intrinsic.

In certain embodiments, the inorganic material can comprise a mixture of two or more inorganic materials.

In certain embodiments, the layer comprising a stratified structure as taught herein can serve as a layer capable of transporting and injecting electrons. In certain embodiments, a zone in a layer comprising a stratified structure as taught herein can have a predetermined conductivity so as to serve as a layer capable of transporting electrons, a layer capable of injecting electrons, and/or a layer capable of blocking holes. In certain embodiments, a zone can comprise a distinct layer.

In accordance with another aspect of there present invention, there is provided a light emitting device wherein the device has an initial turn-on voltage that is not greater than 1240/λ, wherein λ represents the wavelength (nm) of light emitted by the emissive layer.

In certain embodiments, a light emitting device comprising a cathode, a layer comprising a material capable of transporting and injecting electrons, an emissive layer comprising quantum dots, a layer comprising a material capable of transporting holes, a hole injection material, and an anode, the device having an initial turn-on voltage that is not greater than 1240/λ, wherein λ represents the wavelength (nm) of light emitted by the emissive layer.

In certain embodiments the material capable of transporting holes comprises an organic material.

In certain embodiments, the material capable of transporting and injecting electrons comprises an inorganic material.

In certain embodiments, the material capable of transporting and injecting electrons comprises an inorganic semiconductor material.

In certain embodiments, the material capable of transporting and injecting electrons comprises a metal chalcogenide. In certain embodiments, the inorganic material comprises a metal sulfide. In certain preferred embodiments, the material capable of transporting and injecting electrons comprises a metal oxide. In certain embodiments, the inorganic material comprises titanium dioxide.

In certain more preferred embodiments, the inorganic material comprises zinc oxide.

In certain embodiments, the inorganic material comprises a mixture of two or more inorganic materials.

In certain preferred embodiments, the inorganic material comprises a mixture of zinc oxide and titanium oxide.

In certain embodiments the material capable of transporting holes comprises an inorganic material.

In certain embodiments the material capable of transporting holes comprises an organic material.

Preferably in certain embodiments, the layers are formed in the following sequential order: the cathode, the layer comprising a material capable of transporting and injecting electrons comprising an inorganic material, the emissive layer comprising quantum dots, the layer comprising a material capable of transporting holes, the layer comprising a hole injection material, and the anode.

In accordance with another aspect of the present invention, there is provided a light emitting device comprising a pair of electrodes and a layer of a light emissive material provided between the electrodes, wherein light emission from the light emissive material occurs at a bias voltage across the device that is less than the energy in electron-Volts of the bandgap of the emissive material.

In certain embodiments, the light emitting device includes an emissive material comprising quantum dots. In certain embodiments, other well known light emissive materials can be used or included in the device. In certain embodiments, additional layers can also be included. In certain embodiments, the device comprises a light emitting device in accordance with embodiments of the invention taught herein.

In accordance with another aspect of the invention, there are provided displays and other products including the above-described light-emitting device.

In certain embodiments of the present invention taught are taught herein, an emissive layer can include two or more different types of quantum dots, wherein each type is selected to emit light having a predetermined wavelength. In certain embodiments, quantum dot types can be different based on, for example, factors such composition, structure and/or size of the quantum dot. In certain embodiments, quantum dots can be selected to emit at any predetermined wavelength across the electromagnetic spectrum. An emissive layer can include different types of quantum dots that have emissions at different wavelengths.

In certain embodiments, the light emitting device includes quantum dots capable of emitting visible light.

In certain embodiments, the light emitting device includes quantum dots capable of emitting infrared light.

As used herein, the terms "inorganic material" and "organic material" may be further defined by a functional descriptor, depending on the desired function being addressed. In certain embodiments, the same material can address more than one function.

In some embodiments, it may be desirable to have different conductivities which can be accomplished, for example, by changing the carrier mobility and/or charge density of a material in a zone and/or layer.

In certain embodiments including a stratified structure, horizontal zones are preferably parallel to the cathode.

Other aspects and embodiments of the invention relate to materials and methods that are useful in making the above described light-emitting devices, displays, and other products including the above-described light-emitting device.

The foregoing, and other aspects described herein, all constitute embodiments of the present invention.

It is to be understood that both the foregoing general description and the following detailed description are exemplary and explanatory only and are not restrictive of the invention as claimed. Other embodiments will be apparent to those skilled in the art from consideration of the description and drawings, from the claims, and from practice of the invention disclosed herein.

BRIEF DESCRIPTION OF THE DRAWINGS

In the drawings:

FIG. 5 graphically presents performance data for the Green Light Emitting Device (A) and the Blue Light emitting Device (B) of the Examples.

The attached figures are simplified representations presented for purposes of illustration only; the actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF THE INVENTION

Figure 1:
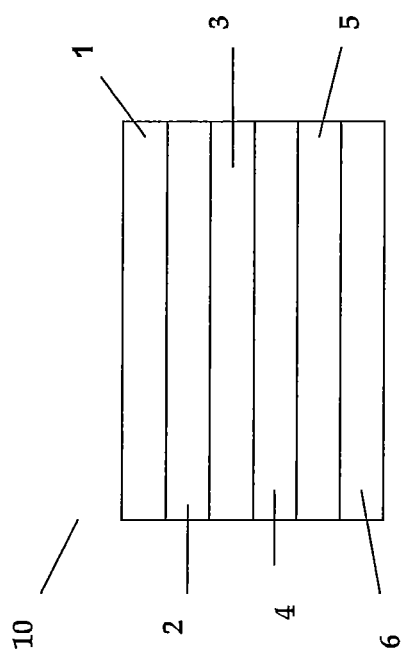
FIG. 1 is schematic drawing depicting an example of an embodiment of a light-emitting device structure in accordance with the invention.

FIG. 1 provides a schematic representation of an example of the architecture of a light-emitting device according to one embodiment of the present invention. Referring to FIG. 1, the light-emitting device 10 includes (from top to bottom) an anode 1, a layer comprising a hole injection material 2, a layer comprising a material capable of transporting holes (also referred to herein as a "hole transport material") 3, a layer including quantum dots 4, a layer comprising a material capable of transporting and injecting electrons (also referred to herein as an "electron transport material") comprising an inorganic material 5, a cathode 6, and a substrate (not shown). When voltage is applied across the anode and cathode, the anode injects holes into the hole injection material while the cathode injects electrons into the electron transport material. The injected holes and injected electrons combine to form an exciton on the quantum dot and emit light.

The substrate (not shown) can be opaque or transparent. A transparent substrate can be used, for example, in the manufacture of a transparent light emitting device. See, for example, Bulovic, V. et al., Nature 1996, 380, 29; and Gu, G. et al., Appl. Phys. Lett. 1996, 68, 2606-2608, each of which is incorporated by reference in its entirety. The substrate can be rigid or flexible. The substrate can be plastic, metal, semiconductor wafer, or glass. The substrate can be a substrate commonly used in the art. Preferably the substrate has a smooth surface. A substrate surface free of defects is particularly desirable.

The cathode 6 can be formed on the substrate (not shown). In certain embodiments, a cathode can comprise, ITO, aluminum, silver, gold, etc. The cathode preferably comprises a material with a work function chosen with regard to the quantum dots included in the device. In certain embodiments, the absolute value of the difference between $E_{LUMO}$ of the quantum dots and the work function of the cathode is less than about 0.5 eV. In certain embodiments the absolute value of the difference between $E_{LUMO}$ of the quantum dots and the work function of the cathode is less than about 0.3 eV, and preferably less than about 0.2 eV. $E_{LUMO}$ of the quantum dots represents the energy level of the lowest unoccupied molecular orbital (LUMO) of the quantum dot. For example, a cathode comprising indium tin oxide (ITO) can be preferred for use with an emissive material including quantum dots comprising a CdSe core/CdZnSe shell.

Substrates including patterned ITO are commercially available and can be used in making a device according to the present invention.

The layer comprising a material capable of transporting and injection electrons 5 preferably comprises an inorganic material. In certain embodiments, the inorganic material included in the layer capable or transporting and injection electrons comprises an inorganic semiconductor material. Preferred inorganic semiconductor materials include those having a band gap that is greater than the emission energy of the emissive material. In certain embodiments, the absolute value of the difference between $E_{LUMO}$ of the quantum dots and $E_{conduction\ band\ edge}$ of material capable of transporting and injecting electrons, is less than about 0.5 eV. In certain embodiments, the absolute value of the difference between $E_{LUMO}$ of the quantum dots and $E_{conduction\ band\ edge}$ of the material capable of transporting and injecting electrons, is less than about 0.3 eV, and preferably less than about 0.2 eV. $E_{LUMO}$ of the quantum dots represents the energy level of the lowest unoccupied molecular orbital (LUMO) of the quantum dots; $E_{of\ the\ conduction\ band\ edge}$ of the material capable of transporting and injecting electrons represents the energy level of the conduction band edge of the material capable of transporting and injecting electrons.

Examples of inorganic semiconductor materials include a metal chalcogenide, a metal pnictide, or elemental semiconductor, such as a metal oxide, a metal sulfide, a metal selenide, a metal telluride, a metal nitride, a metal phosphide, a metal arsenide, or metal arsenide. For example, an inorganic semiconductor material can include, without limitation, zinc oxide, a titanium oxide, a niobium oxide, an indium tin oxide, copper oxide, nickel oxide, vanadium oxide, chromium oxide, indium oxide, tin oxide, gallium oxide, manganese oxide, iron oxide, cobalt oxide, aluminum oxide, thallium oxide, silicon oxide, germanium oxide, lead oxide, zirconium oxide, molybdenum oxide, hafnium oxide, tantalum oxide, tungsten oxide, cadmium oxide, iridium oxide, rhodium oxide, ruthenium oxide, osmium oxide, zinc sulfide, zinc selenide, zinc telluride, cadmium sulfide, cadmium selenide, cadmium telluride, mercury sulfide, mercury selenide, mercury telluride, silicon carbide, diamond (carbon), silicon, germanium, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, lead telluride, iron sulfide, indium selenide, indium sulfide, indium telluride, gallium sulfide, gallium selenide, gallium telluride, tin selenide, tin telluride, tin sulfide, magnesium sulfide, magnesium selenide, magnesium telluride, barium titanate, barium zirconate, zirconium silicate, yttria, silicon nitride, and a mixture of two or more thereof. In certain embodiments, the inorganic semiconductor material can include a dopant.

In certain preferred embodiments, an electron transport material can include an n-type dopant.

An example of a preferred inorganic semiconductor material for inclusion in an electron transport material of a device in accordance with the invention is zinc oxide. In certain embodiments, zinc oxide can be mixed or blended with one or more other inorganic materials, e.g., inorganic semiconductor materials, such as titanium oxide.

As mentioned above, in certain preferred embodiments, a layer comprising a material capable of transporting and injecting electrons can comprise zinc oxide. Such zinc oxide can be prepared, for example, by a sol-gel process. In certain embodiments, the zinc oxide can be chemically modified. Examples of chemical modification include treatment with hydrogen peroxide.

In other preferred embodiments, a layer comprising a material capable of transporting and injecting electrons can comprise a mixture including zinc oxide and titanium oxide.

The electron transport material is preferably included in the device as a layer. In certain embodiments, the layer has a thickness in a range from about 10 nm to 500 nm.

Electron transport materials comprising an inorganic semiconductor material can be deposited at a low temperature, for example, by a known method, such as a vacuum vapor deposition method, an ion-plating method, sputtering, inkjet printing, sol-gel, etc. For example, sputtering is typically performed by applying a high voltage across a low-pressure gas (for example, argon) to create a plasma of electrons and gas ions in a high-energy state. Energized plasma ions strike a target of the desired coating material, causing atoms from that target to be ejected with enough energy to travel to, and bond with, the substrate.

In certain embodiments, the layer comprising a material capable of transporting and injecting electrons can comprise a stratified structure comprising an inorganic material, wherein the stratified structure includes two or more horizontal zones having different conductivities. For example, in certain embodiments, the layer can include a first zone at the upper portion of the layer (nearer the emissive layer) comprising an intrinsic or slightly n-type doped inorganic material (e.g., sputtered intrinsic or slightly n-type doped zinc oxide) with electron transporting characteristics, and a second zone at the lower portion of the layer (more remote from the emissive layer) comprising inorganic material that has a higher concentration of n-type doping than the material in the first zone (e.g., sputtered n-type doped ZnO) with electron injection characteristics.

Figure 16:
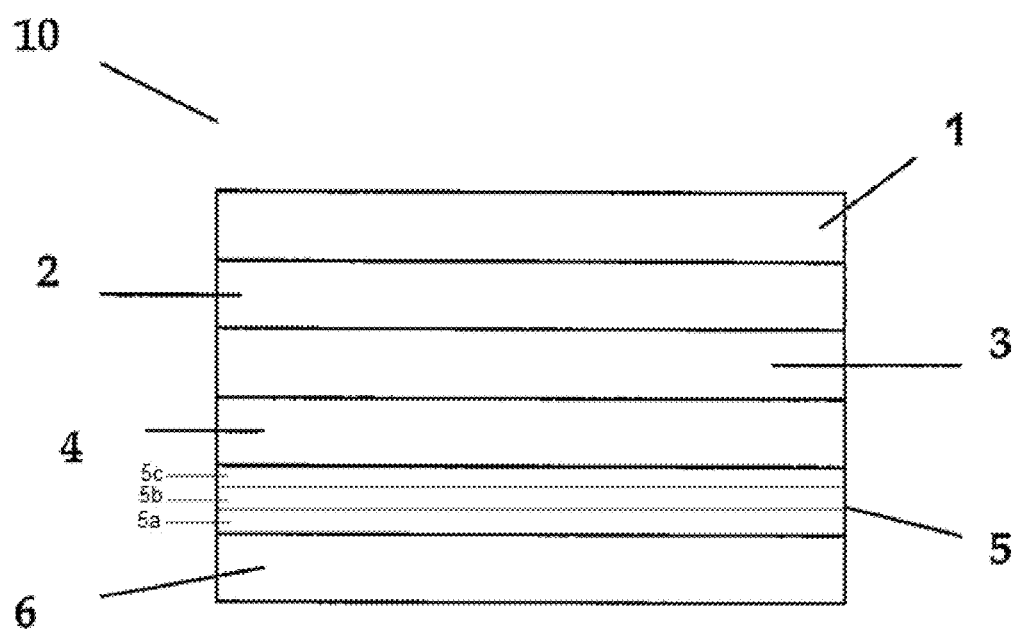
FIG. 16 is a schematic drawing depicting an example of an embodiment of a light-emitting device structure in accordance with the invention.

In another example, in certain embodiments as shown in FIG. 16, the layer can include three horizontal zones, e.g., a first zone 5c at the upper portion of the layer (nearest the emissive layer 4) comprising an intrinsic inorganic material (e.g., sputtered intrinsic zinc oxide) which can be hole blocking; a second zone 5b (between the first zone and the third zone) comprising an intrinsic or slightly n-type doped inorganic material (e.g., sputtered intrinsic or slightly n-type doped zinc oxide or another metal oxide) which can be electron transporting; and a third zone 5a at the lowest portion of the layer (most remote from the emissive layer 4) comprising inorganic material that has a higher concentration of n-type doping than the material in the second zone (e.g., sputtered n-type doped ZnO or another metal oxide) which can be electron injecting.

In certain embodiments, the inorganic material included in the stratified structure comprises an inorganic semiconductor material. In certain preferred embodiments, the inorganic material comprises a metal chalcogenide. In certain embodiments, the inorganic material comprises a metal sulfide. In certain preferred embodiments, the inorganic material comprises a metal oxide. In certain embodiments, the inorganic material comprises titanium dioxide. In certain more preferred embodiments, the inorganic material comprises zinc oxide. In certain embodiments, the inorganic material can comprise a mixture of two or more inorganic materials. Other inorganic materials taught herein for inclusion in a layer comprising a material capable of transporting and injection electrons can also be included in a stratified structure.

Additional information concerning inorganic materials that may be useful for inclusion in an electron transport layer is disclosed in International Application No. PCT/US2006/005184, filed 15 Feb. 2006, for "Light Emitting Device Including Semiconductor Nanocrystals, which published as WO 2006/088877 on 26 Aug. 2006, the disclosure of which is hereby incorporated herein by reference in its entirety.

The surface of the device on which an inorganic semiconductor material is to be formed can be cooled or heated for temperature control during the growth process. The temperature can affect the crystallinity of the deposited material as well as how it interacts with the surface it is being deposited upon. The deposited material can be polycrystalline or amorphous. The deposited material can have crystalline domains with a size in the range of 10 Angstroms to 1 micrometer. If doped, the doping concentration can be controlled by, for example, varying the gas, or mixture of gases, with a sputtering plasma technique. The nature and extent of doping can influence the conductivity of the deposited film, as well as its ability to optically quench neighboring excitons.

The emissive material 4 includes quantum dots. In certain embodiments, the quantum dots comprise an inorganic semiconductor material. In certain preferred embodiments, the quantum dots comprise crystalline inorganic semiconductor material (also referred to as semiconductor nanocrystals). Examples of preferred inorganic semiconductor materials include, but are not limited to, Group II-VI compound semiconductor nanocrystals, such as CdS, CdSe, ZnS, ZnSe, ZnTe, HgS, HgSe, HgTe, and other binary, ternary, and quaternary II-VI compositions; Group III-V compound semiconductor nanocrystals, such as GaP, GaAs, InP and InAs; PbS; PbSe; PbTe, and other binary, ternary, and quaternary III-V compositions. Other non-limiting examples of inorganic semiconductor materials include Group II-V compounds, Group III-VI compounds, Group IV-VI compounds, Group I-III-VI compounds, Group I-IV-VI compounds, Group II-IV-V compounds, Group IV elements, an alloy including any of the foregoing, and/or a mixture including any of the foregoing. Further, materials for the quantum dot light-emitting layer may be core-shell structured nanocrystals (for example, CdSe/ZnS, CdS/ZnSe, InP/ZnS, etc.) wherein the core is composed of a semiconductor nanocrystal (e.g. CdSe, CdS, etc.) and the shell is composed of a crystalline inorganic semiconductor material (e.g., ZnS, ZnSe, etc.).

Quantum dots can also have various shapes, including, but not limited to, sphere, rod, disk, other shapes, and mixtures of various shaped particles.

An emissive material can comprise one or more different quantum dots. The differences can be based, for example, on different composition, different size, different structure, or other distinguishing characteristic or property.

The color of the light output of a light-emitting device can be controlled by the selection of the composition, structure, and size of the quantum dots included in a light-emitting device as the emissive material.

The emissive material is preferably included in the device as a layer. In certain embodiments, the emissive layer can comprise one or more layers of the same or different emissive material(s). In certain embodiments, the emissive layer can have a thickness in a range from about 1 nm to about 20 nm. In certain embodiments, the emissive layer can have a thickness in a range from about 1 nm to about 10 nm. In certain embodiments, the emissive layer can have a thickness in a range from about 3 nm to about 6 about nm. In certain embodiments, the emissive layer can have a thickness of about 4 nm. A thickness of 4 nm can be preferred in a device including an electron transport material including a metal oxide.

Preferably, the quantum dots include one or more ligands attached to the surface thereof. In certain embodiments, a ligand can include an alkyl (e.g., $C_1$-$C_{20}$) species. In certain embodiments, an alkyl species can be straight-chain, branched, or cyclic. In certain embodiments, an alkyl species can be substituted or unsubstituted. In certain embodiments, an alkyl species can include a hetero-atom in the chain or cyclic species. In certain embodiments, a ligand can include an aromatic species. In certain embodiments, an aromatic species can be substituted or unsubstituted. In certain embodiments, an aromatic species can include a heteroatom. Additional information concerning ligands is provided herein and in various of the below-listed documents which are incorporated herein by reference.

By controlling the structure, shape and size of quantum dots during preparation, energy levels over a very broad range of wavelengths can be obtained while the properties of the bulky materials are varied. Quantum dots (including but not limited to semiconductor nanocrystals) can be prepared by known techniques. Preferably they are prepared by a wet chemistry technique wherein a precursor material is added to a coordinating or non-coordinating solvent (typically organic) and nanocrystals are grown so as to have an intended size. According to the wet chemistry technique, when a coordinating solvent is used, as the quantum dots are grown, the organic solvent is naturally coordinated to the surface of the quantum dots, acting as a dispersant. Accordingly, the organic solvent allows the quantum dots to grow to the nanometer-scale level. The wet chemistry technique has an advantage in that quantum dots of a variety of sizes can be uniformly prepared by appropriately controlling the concentration of precursors used, the kind of organic solvents, and preparation temperature and time, etc.

The emission from a quantum dot capable of emitting light (e.g., a semiconductor nanocrystal) can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light (e.g., semiconductor nanocrystals) can result in emission of light in a narrow spectral range. The population can be monodisperse preferably exhibits less than a 15% rms (root-mean-square) deviation in diameter of such quantum dots, more preferably less than 10%, most preferably less than 5%. Spectral emissions in a narrow range of no greater than about 75 nm, no greater than about 60 nm, no greater than about 40 nm, and no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

For example, semiconductor nanocrystals can have high emission quantum efficiencies such as greater than 10%, 20%, 30%, 40%, 50%, 60%, 70%, 80%, or 90%.

The narrow FWHM of semiconductor nanocrystals can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A pattern including more than one size of semiconductor nanocrystal can emit light in more than one narrow range of wavelengths. The color of emitted light perceived by a viewer can be controlled by selecting appropriate combinations of semiconductor nanocrystal sizes and materials. The degeneracy of the band edge energy levels of semiconductor nanocrystals facilitates capture and radiative recombination of all possible excitons.

Transmission electron microscopy (TEM) can provide information about the size, shape, and distribution of the semiconductor nanocrystal population. Powder X-ray difraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

An emissive material can be deposited by spin-casting, screen-printing, inkjet printing, gravure printing, roll coating, drop-casting, Langmuir-Blodgett techniques, contact printing or other techniques known or readily identified by one skilled in the relevant art.

In certain embodiments, a layer comprising a spacer material (not shown) can be included between the emissive material and a layer of the device adjacent thereto, for example, an electron transport layer and/or a hole transport layer. A layer comprising a spacer material can promote better electrical interface between the emissive layer and the adjacent charge transport layer. A spacer material may comprise an organic material or an inorganic material. In certain embodiments, a spacer material comprises parylene. Preferably, the spacer material comprises an ambipolar material. More preferably, it is non-quenching. In certain embodiments, for example, a spacer material between the emissive layer and a hole transport layer can comprise an ambipolar host or hole transport material, or nanoparticles such as nickel oxide, and other metal oxides.

Examples of hole transport materials 3 include organic material and inorganic materials. An example of an organic material that can be included in a hole transport layer includes an organic chromophore. The organic chromophore can include a phenyl amine, such as, for example, N,N'-diphenyl-N,N'-bis(3-methylphenyl)-(1,1'-biphenyl)-4,4'-diamine (TPD). Other hole transport layer can include (N,N'-bis(3-methylphenyl)-N,N'-bis(phenyl)-spiro (spiro-TPD), 4-4'-N,N'-dicarbazolyl-biphenyl (CBP), 4,4-. bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, N,N,N',N'-tetraarylbenzidine, poly(3,4-ethylenedioxythiophene) (PEDOT)/polystyrene para-sulfonate (PSS) derivatives, poly-N-vinylcarbazole derivatives, polyphenylenevinylene derivatives, polyparaphenylene derivatives, polymethacrylate derivatives, poly(9,9-octylfluorene) derivatives, poly(spiro-fluorene) derivatives, N,N'-di(naphthalene-1-yl)-N,N'-diphenyl-benzidine (NPB), tris(3-methylphenylphenylamino)-triphenylamine (m-MTDATA), and poly(9,9'-dioctylfluorene-co-N-(4-butylphenyl)diphenylamine (TFB), and spiro-NPB.

In certain preferred embodiments, a hole transport layer comprises an organic small molecule material, a polymer, a spiro-compound (e.g., spiro-NPB), etc.

In certain embodiments of the inventions described herein, a hole transport layer can comprise an inorganic material. Examples of inorganic materials include, for example, inorganic semiconductor materials capable of transporting holes. The inorganic material can be amorphous or polycrystalline Examples of such inorganic materials and other information related to fabrication of inorganic hole transport materials that may be helpful are disclosed in International Application No. PCT/US2006/005184, filed 15 Feb. 2006, for "Light Emitting Device Including Semiconductor Nanocrystals, which published as WO 2006/088877 on 26 Aug. 2006, the disclosure of which is hereby incorporated herein by reference in its entirety.

Hole transport materials comprising, for example, an inorganic material such as an inorganic semiconductor material, can be deposited at a low temperature, for example, by a known method, such as a vacuum vapor deposition method, an ion-plating method, sputtering, inkjet printing, sol-gel, etc.

Organic hole transport materials may be deposited by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., $\leq 10^{-8}$ torr), high vacuum (e.g., from about $10^{-8}$ torr to about $10^{-5}$ torr), or low vacuum conditions (e.g., from about $10^{-5}$ torr to about $10^{-3}$ torr).

Hole transport materials comprising organic materials and other information related to fabrication of organic charge transport layers that may be helpful are disclosed in U.S. patent application Ser. No. 11/253,612 for "Method And System For Transferring A Patterned Material", filed 21 Oct. 2005, and Ser. No. 11/253,595 for "Light Emitting Device Including Semiconductor Nanocrystals", filed 21 Oct. 2005, each of which is hereby incorporated herein by reference in its entirety.

The hole transport material is preferably included in the device as a layer. In certain embodiments, the layer can have a thickness in a range from about 10 nm to about 500 nm.

Device 10 includes a hole-injection material 2. The hole-injection material may comprise a separate hole injection material or may comprise an upper portion of the hole transport layer that has been doped, preferably p-type doped. The hole-injection material can be inorganic or organic. Examples of organic hole injection materials include, but are not limited to, LG-101 (see, for example, paragraph [0024] of EP 1 843 411 A1) and other HIL materials available from LG Chem, LTD. Other organic hole injection materials can be used. Examples of p-type dopants include, but are not limited to, stable, acceptor-type organic molecular material, which can lead to an increased hole conductivity in the doped layer, in comparison with a non-doped layer. In certain embodiments, a dopant comprising an organic molecular material can have a high molecular mass, such as, for example, at least 300 amu. Examples of dopants include, without limitation, $F_4$-TCNQ, $FeCl_3$, etc. Examples of doped organic materials for use as a hole injection material include, but are not limited to, an evaporated hole transport material comprising, e.g., 4,4',4''-tris (diphenylamino)triphenylamine (TDATA) that is doped with tetrafluoro-tetra-cyano-quinodimethane ($F_4$-TCNQ); p-doped phthalocyanine (e.g., zinc-phthalocyanine (ZnPc) doped with $F_4$-TCNQ (at, for instance, a molar doping ratio of approximately 1:30); N,N'-diphenyl-N,N'-bis(1-naphthyl)-1,1'biphenyl-4,4''diamine (alpha-NPD) doped with $F_4$-TCNQ. See J. Blochwitz, et al., "Interface Electronic Structure Of Organic Semiconductors With Controlled Doping Levels", *Organic Electronics* 2 (2001) 97-104; R. Schmechel, 48, Internationales Wissenschaftliches Kolloquium, Technische Universtaat Ilmenau, 22-25 Sep. 2003; C. Chan et al., "Contact Potential Difference Measurements Of Doped Organic Molecular Thin Films", *J. Vac. Sci. Technol. A* 22(4), July/August 2004. The disclosures of the foregoing papers are hereby incorporated herein by reference in their entireties. See also, Examples of p-type doped inorganic hole transport materials are described in U.S. Patent Application No. 60/653,094 entitled "Light Emitting Device Including Semiconductor Nanocrystals, filed 16 Feb. 2005, which is hereby incorporated herein by reference in its entirety. Examples of p-type doped organic hole transport materials are described in U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

As shown in FIG. 1, anode 1 may comprise an electrically conductive metal or its oxide that can easily inject holes. Examples include, but are not limited to, ITO, aluminum, aluminum-doped zinc oxide (AZO), silver, gold, etc. Other suitable anode materials are known and can be readily ascertained by the skilled artisan. The anode material can be deposited using any suitable technique. In certain embodiments, the anode can be patterned.

In certain embodiments, the light-emitting device may be fabricated by sequentially forming the cathode 6, the electron transport material comprising an inorganic material 5, the emissive material 4, the hole transport material 3, and the anode 2. This sequential approach avoids the deposition of the emissive material comprising quantum dots directly onto an organic material.

In certain embodiments, an adhesion promoter can be included between the electron transport material and the emissive material. One example of a suitable adhesion promoter is ozone treatment of the upper surface of the electron transport material. Other adhesion promoters can be used.

In certain embodiments, the electrode (e.g., anode or cathode) materials and other materials are selected based on the light transparency characteristics thereof so that a device can be prepared that emits light from the top surface thereof. A top emitting device can be advantageous for constructing an active matrix device (e.g., a display). In certain embodiments, the electrode (e.g., anode or cathode) materials and other materials are selected based on light transparency characteristics thereof so that a device can be prepared that emits light from the bottom surface thereof.

As mentioned above, the device can further include a substrate (not shown in the figure). Examples of substrate materials include, without limitation, glass, plastic, insulated metal foil.

In certain embodiments, a device can further include a passivation or other protective layer that can be used to protect the device from the environment. For example, a protective glass layer can be included to encapsulate the device. Optionally a desiccant or other moisture absorptive material can be included in the device before it is sealed, e.g., with an epoxy, such as a UV curable epoxy. Other desiccants or moisture absorptive materials can be used.

In accordance with another aspect of the present invention, there is provided a method for preparing a light emitting device, such as, for example, a device as illustrated in FIG. 1. The method comprising: forming a layer comprising a material capable of transporting and injecting electrons on a cathode, wherein the material capable of transporting and injecting electrons comprises an inorganic material; applying an emissive layer comprising quantum dots thereover; forming a layer comprising a material capable of transporting holes comprising an organic material over the emissive layer; forming a layer comprising a hole injection material over the layer comprising a material capable of transporting holes; and forming an anode over the layer comprising a hole injection material.

Examples of materials that can be included in the method include those described herein.

Other information and techniques described herein and incorporated by reference can also be useful in practicing a method in accordance with the present invention.

In accordance with another aspect of the present invention, there is provided a light emitting device including a pair of electrodes, a layer comprising a light emissive material comprising quantum dots provided between the electrodes, and a layer comprising a material capable of transporting electrons comprising an inorganic material provided between the emissive layer and one of the electrodes, wherein the layer comprising the material capable of transporting electrons comprising an inorganic material comprises a stratified structure including two or more horizontal zones having different conductivities. The inorganic material included in different zones of the stratified structure can be doped or undoped forms of the same or different materials.

In certain embodiments, the inorganic material comprises an inorganic semiconductor material. For example, if a first zone comprises an intrinsic inorganic semiconductor material, a second zone, adjacent thereto, can comprise a doped inorganic semiconductor material; if a first zone comprises an n-type doped inorganic semiconductor material, a second zone, adjacent thereto, can comprise a slightly lower n-type doped or intrinsic inorganic semiconductor material. In certain embodiments, the inorganic semiconductor material that is doped can be a doped form of an intrinsic material included in another zone of the stratified structure. While these examples describe a stratified structure including two zones, a stratified structure can include more than two zones. The inorganic semiconductor material included in different zones of the stratified structure can be doped or undoped forms of the same or different materials.

In certain embodiments, the layer comprising a stratified structure can serve as a layer capable of transporting and injecting electrons. In certain embodiments, a zone in a layer comprising a stratified structure can have a predetermined conductivity so as to serve as a layer capable of transporting electrons, a layer capable of injecting electrons, and/or a layer capable of blocking holes. In certain embodiments, a zone can comprise a distinct layer.

In certain embodiments, the inorganic material comprises a metal chalcogenide. In certain embodiments, the inorganic material comprises a metal sulfide. In certain preferred embodiments, the inorganic material comprises a metal oxide. In certain embodiments, the inorganic material comprises titanium dioxide. In certain more preferred embodiments, the inorganic material comprises zinc oxide. In certain embodiments, the inorganic material comprises a mixture of two or more inorganic materials. Other examples of inorganic semiconductor materials that can be used include those described elsewhere herein.

In certain embodiments, a layer comprising an inorganic semiconductor material that includes a stratified structure as taught herein can serve as a layer capable of transporting electrons, injecting electrons, and/or blocking holes.

Examples of materials useful for the anode and cathode include those described elsewhere herein.

Quantum dots included in the emissive layer can include those described elsewhere herein.

In certain embodiments, different conductivities can be accomplished, for example, by changing the carrier mobility and/or charge density of the material.

In certain embodiments including an inorganic material comprising a metal oxide, for example, conduction properties of layers comprising a metal oxide are highly dependent on the concentration of oxygen in the layer structure since vacancies are the main mode of carrier conduction. For example, in certain embodiments, to control the oxygen concentration in sputter deposited layers (e.g., made by magnetron RF sputter deposition) two properties of the deposition can be altered. The power of deposition can be varied, increasing and decreasing the amount of oxygen that is incorporated in the layer. The powers and resulting conductivities are highly dependent on the material and the sputter system used. More oxygen can also be incorporated into the layer by adding oxygen to the sputter chamber gas environment which is often dominated by noble gases like Argon. Both the power and oxygen partial pressure can be used or customized to produce the desired layered metal oxide structure. Lowering the RF power during deposition can increase the conductivity of the layer, reducing the parasitic resistance of the layer. To deposit a low conductivity layer, oxygen is incorporated into the deposition ambient to place a thin insulating surface on the layer formed.

Other information and techniques described herein and incorporated by reference can also be useful with this aspect of the present invention.

In accordance with another aspect of the present invention, there is provided a light emitting device comprising a pair of electrodes and a layer of a light emissive material provided between the electrodes, wherein light emission from the light emissive material occurs at a bias voltage across the device that is less than the energy in electron-Volts of the bandgap of the emissive material. In certain embodiments, the light emitting device includes an emissive material comprising quantum dots.

Examples of quantum dots included in the emissive layer can include those described elsewhere herein.

In certain embodiments, other well known light emissive materials can be used or included in the device.

Examples of materials useful for the electrodes include those described elsewhere herein.

In certain embodiments, additional layers described herein can also be included.

Other information and techniques described herein and incorporated by reference can also be useful with this aspect of the present invention.

In certain embodiments, the device comprises one of the light emitting devices taught herein.

In accordance with another aspect of there present invention, there is provided a light emitting device wherein the device has an initial turn-on voltage that is not greater than $1240/\lambda$, wherein $\lambda$ represents the wavelength (nm) of light emitted by the emissive layer.

In certain embodiments, a light emitting device comprising a cathode, a layer comprising a material capable of transporting and injecting electrons comprising an inorganic material, an emissive layer comprising quantum dots, a layer comprising a material capable of transporting holes, a hole injection material, and an anode, the device having an initial turn-on voltage that is not greater than $1240/\lambda$, wherein $\lambda$ represents the wavelength (nm) of light emitted by the emissive layer.

Examples of materials useful for the anode and cathode include those described elsewhere herein.

Examples of materials useful for the layer comprising a material capable of transporting and injection electrons include those described elsewhere herein.

Examples of materials useful for the layer comprising a material capable of transporting holes include those described elsewhere herein.

Examples of materials useful for the layer comprising a hole injection material include those described elsewhere herein.

In certain embodiments, additional layers described herein can also be included.

Other information and techniques described herein and incorporated by reference can also be useful with this aspect of the present invention.

In certain embodiments, the device comprises one of the light emitting devices taught herein.

In certain embodiments an additional hole transport material with a hole conductivity between that of the hole injection material and the hole transport material can be interposed between them. Additional hole transport materials can be interposed between two other hole conductive materials included in the device. Preferably, any additional interposed hole transport material will have a hole conductivity that falls in-between those of the hole transport materials between which it is interposed.

Figure 2:
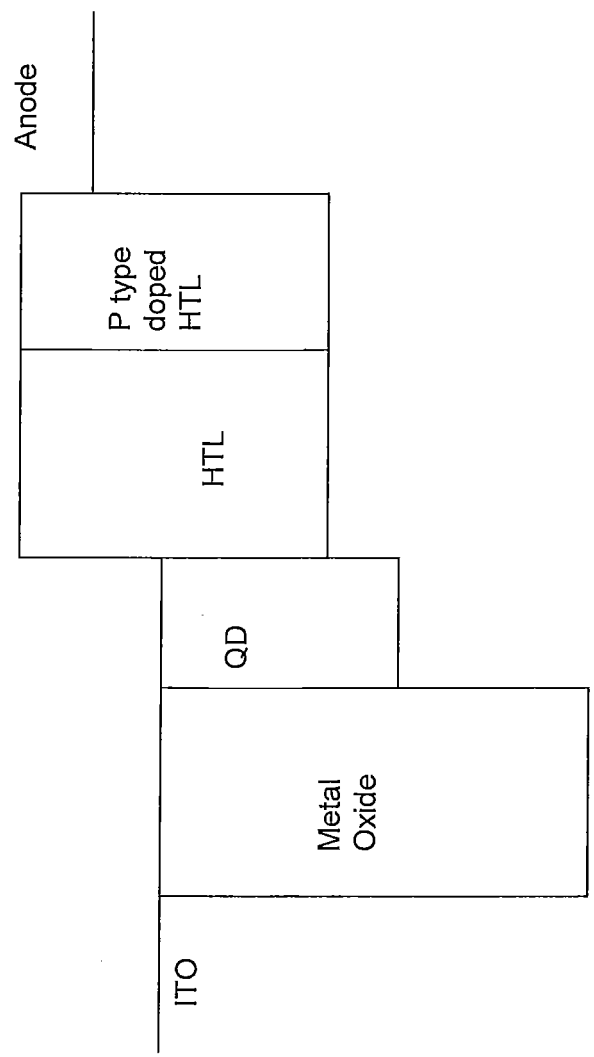
FIG. 2 provides a schematic band structure of an example of an embodiment of a light-emitting device in accordance with the invention.

FIG. 2 schematically provides the band structure of an example of an embodiment of a light emitting device of the present invention. In the depicted example, a metal oxide is used as a layer that is electron transporting and injecting and hole blocking. Such layer can be fabricated with solution process or thermal evaporation. An electron transport layer including ZnO is preferred. In certain embodiments, ZnO can be preferably doped to form an ohmic contact with the cathode. In the depicted example, the hole transport layer (HTL) can comprise an organic material (e.g., small organic molecules (for example, TPD, spiro-TPB, NPB, spiro-NPB, etc.). In certain embodiments, the HTL can comprise an inorganic material. A hole injection layer (or p-type doped HTL) is also included in the depicted example to enhance hole supply from the anode. In the depicted structure, electrons are transported through the metal oxide and holes are transported through the HTL, excitons are generated in the quantum dot (QD) layer. The composition and size of the quantum dots are selected to achieve light emission with a predetermined color or wavelength.

A light-emitting device in accordance with the invention can be used to make a light-emitting device including red-emitting, green-emitting, and/or blue-emitting quantum dots. Other color light-emitting quantum dots can be included, alone or in combination with one or more other different quantum dots. In certain embodiments, separate layers of one or more different quantum dots may be desirable. In certain embodiments, a layer can include a mixture of two or more different quantum dots.

The present invention will be further clarified by the following non-limiting examples, which are intended to be exemplary of the present invention.

EXAMPLES

In the following examples, the quantum dots included in the emissive layer may comprise red-emitting core/shell semiconductor nanocrystals (also abbreviated herein as "SOP", "R-SOP"), green-emitting core/shell semiconductor nanocrystals (also abbreviated herein as "GQD"), blue-emitting core/shell semiconductor nanocrystals (also abbreviated herein as "BQD"), or yellow-emitting core/shell semiconductor nanocrystals (also abbreviated herein as "YQD"), which are prepared generally according to the following respective procedures. In any instances where a quantum dot is described by a "10×" modifier, the preparation is generally carried out on a scale approximately ten times that of the respective preparation procedure described below.

I. Quantum Dot Preparations

Red-Emitting Quantum Dot Preparation

A. Synthesis of CdSe Semiconductor Nanocrystal Cores 230 mg of anhydrous cadmium acetate ($Cd(OAc)_2$) (1 mmol) (Prochem) and 4 mL of Tri-n-octylphosphine (TOP) (Strem 97%) is added to a 20 mL septum capped vial. The vial is suspended in a 140° C. oil bath (silicon oil). The content of the vial is degassed for about one-half hour. After the cadmium acetate solution is degassed, and the cadmium acetate is dissolved, the vacuum is closed and the vial is opened to nitrogen. The vial is removed from the oil bath and permitted to cool to room temperature while under nitrogen.

6.00 grams of Tri-n-octylphosphine oxide (TOPO) (99% Strem) and 0.668 grams of octadecylphosphonic acid (ODPA) (Polycarbon) are added to a 50 mL three necked round bottom flask. The ingredients are stirred and heated to a temperature of about 120° C. Once the flask reaches 120° C., the solution is degassed for 2 hours while maintained at 120° C. When the solution in the round bottom flask has finished degassing, the vacuum valve is closed and the flask is opened to nitrogen and stirred.

4 mL of the cadmium acetate solution is mixed and injected into the round bottom flask via a septum cap from a syringe filled under nitrogen. The temperature is increased to about 270° C. When the temperature of the solution in the round bottom flask stabilizes at 270° C., 2 mL of Tri-n-butylphosphine (TBP) (Strem 99%) is injected into the round bottom flask from a 5 mL syringe. When the contents of the round bottom flask has restabilized at 270° C., 1.1 mL of Tri-n-butylphosphine selenide (TBPSe) (1.5M) is injected into the round bottom flask. The temperature controller is adjusted to 250° C. After a brief delay (5 secs), the solution turns yellow then red.

Periodic samples are taken until an absorbance of ~560 nm is obtained, at which time the heating mantle is removed and the solution is permitted to cool while stirring. When the temperature is 100° C., the solution is divided into half into 2 centrifuge tubes, and 2× volume of 3:1 methanol/isopropanol is added to each tube to precipitate semiconductor nanocrystal cores. The supernatant is poured off, and the semiconductor nanocrystal cores are mixed with hexane (minimum volume 2.5 mL in each tube). The contents of the two centrifuge tubes are then combined, centrifuged for 5 minutes at 4000 rpm, and filtered with hexane using a 0.2 micron filter.

B. Overcoating the CdSe Cores to Prepare CdSe/CdZnS Semiconductor Nanocrystals

Two 5 mL syringes are prepared in the glove box with the precursors for the overcoating.

The first syringe: 4 mL of Tri-n-octylphosphine (TOP) (97% Strem), 48.24 mg dimethylcadmium, and 41.81 mg diethylzinc.

The second syringe: 4 mL of Tri-n-octylphosphine (TOP) (97% Strem) and 241.68 mg of Bis(TMS)sulfide.

The overcoating precursor mixture for each syringe is prepared by placing the Tri-n-octylphosphine into an 8 mL glass vial. The precursors (dimethylcadmium, diethylzinc, or Bis(TMS)sulfide) are then dripped into the Tri-n-octylphosphine using a micropipette until the right weight of material has been added to each vial. The solution is mixed gently with the vial capped and then drawn up into the 5 mL syringe.

Micro capillary tubing is then loaded onto each syringe and a small amount of solution is pushed through to clear the tubing of nitrogen. (This can optionally be carried out inside a glove box).

Ten (10) grams of Tri-n-octylphosphine oxide (TOPO) (99% Strem) and 0.8 grams of octadecylphosphonic acid (ODPA) (Polycarbon Industries) are added to a 4 neck 50 mL round bottom flask including a football-shaped magnetic stirrer bar. The flask is also equipped with a rubber septum on two of the four necks, a distillation column on the middle neck and the temperature probe in the last neck. The contents of the flask are heated to 130° C. while under nitrogen. When the temperature reaches 130° C., the nitrogen line is closed, and the flask is slowly opened up to vacuum. The contents of the flask are degassed under vacuum at 130° C. for roughly 2 hours. When the solution in the round bottom flask has finished degassing, the vacuum is closed and the flask is opened up to nitrogen. The temperature of the flask is set to 70° C. When the flask has lowered to 70° C., the CdSe cores prepared (approximately 0.09-to 0.1 mmol) as described above in hexane is added to the round bottom flask using a 5 mL syringe. The vacuum is slowly opened up and all of the hexane is removed from the flask, leaving behind the CdSe cores (this can take as long as an hour). When all of the hexane has been removed, the vacuum is closed and the flask is opened up to nitrogen. 0.48 mL of Decylamine [1:1 amine:phosphonic] (using 1 mL syringe) is added and the temperature is increased to 155° C. under nitrogen. The syringes are loaded into syringe pumps to introduce the two lines into the flask (one going through each septum, so that the micro capillary tubing is hugging the flask wall and about 0.5 cm submerged into the stirring solution), and the temperature of the flask is heated to 155° C.; injections are initiated once the temperature is above 110° C. When the flask is at 155° C., the syringe pumps are turned on and the two solutions are pumped into the flask at a rate of 2 mL/hour. with rapid stirring (this will take about two hours). When all of the overcoating solutions from the two syringes has been added to the flask, the syringe pump lines are removed from the flask. Optionally, the temperature can be turned down to 100° C., and 10 mL of toluene can be added and allowed to sit overnight under nitrogen.

C. Clean Up of Core CdSe/CdZnS Core-Shell Semiconductor Nanocrystals:

The total growth solution is divided into two aliquots, each being put into a 50 mL centrifuge tube. An excess ~30 mL of a 3:1 MeOH/Isopropanol mixture is added to each centrifuge tube and stirred. The centrifuge tubes are centrifuged 5 minutes at 4000 rpm. The particles in each tube are dispersed in about 10 mL of hexane with stirring using a vortexer. The centrifuge tubes are then centrifuged for 5 minutes at 4000 rpm. The supernatant includes the hexane and the overcoated cores. The supernatant from each tube is placed into another two centrifuge tubes. (The solid is a salt that has formed and is waste.) The hexane/overcoated core supernatant is filtered using a 0.2 μm syringe filter. An excess of 3:1 methanol/isopropanol is added to each tube to precipitate the overcoated cores. The tubes are centrifuged for 5 minutes at 4000 rpm. The supernatant is poured off. The purified overcoated cores are now at the bottom of the tube and the supernatant is waste.

Green-Emitting Quantum Dot Preparation

A. Synthesis of CdZnSe Semiconductor Nanocrystal Cores

ZnSe semiconductor nanocrystals are prepared by rapidly injecting 86 mg (0.7 mmol) diethyl zinc (Strem) and 1 mL tri-n-octylphosphine selenide (TOP) (97% Strem) (1M) dispersed in 5 mL of tri-n-octylphosphine (TOP) (97% Strem), into a round bottom flask containing 7 grams of degassed oleylamine (distilled from 98% Sigma-Aldrich and degassed at 120° C. under nitrogen with stirring) at 310° C. and then growing at 270° C. for 30 minutes to one hour.

8 mL of the above ZnSe semiconductor nanocrystal growth solution is transferred, while at 160° C., into a degassed solution of 16 grams tri-n-octylphosphine oxide (TOPO) (99% Strem), and 0.665 grams (4 mmol) hexylphosphonic acid (HPA) (Polycarbon Industries), which is also at 160° C. A solution of 1.1 mmol dimethylcadmium (Strem) and 1.2 mL TOPSe (1M) dispersed in 8 mL TOP (97% Strem) is then introduced dropwise (1 drop/~seconds) via a syringe pump into the ZnSe semiconductor nanocrystal growth solution/TOPO/HPA mixture, which is at 150° C. The solution is then stirred at 150° C. for 21 hours. Before overcoating the CdZnSe cores with CdZnS, the CdZnSe cores are isolated by precipitating them out of solution twice with a miscible non-solvent.

B. Overcoating the CdZnSe Cores to Prepare CdZnSe/CdZnS Semiconductor Nanocrystals The CdZnS shell is grown by introducing dropwise a solution of dimethylcadmium (20% of total moles of cation for a shell of predetermined thickness) (Strem), diethylzinc (Strem), and hexamethyldisithiane (2 fold excess of amount for a shell of predetermined thickness) (Fluka) in 8 mL of TOP into a degassed solution of 10 grams of TOPO (99% Strem) and 0.4 grams (2.4 mmol) HPA (Polycarbon Industries), which contains the CdZnSe cores, at a temperature of 140° C. (the CdZnSe cores dispersed in hexane are added to the degasses TOPO/HPA solution and the hexane is pulled off at 70° C. under vacuum prior to addition of the shell precursors).

Blue-Emitting Quantum Dot Preparation

A. Synthesis of CdZnS Semiconductor Nanocrystal Cores 0.050 g CdO (99.98% Puratronic) and 0.066 g of ZnO (99.99% Sigma Aldrich) is weighed out into a 100 mL three necked flask. 4 mL oleic acid (90% tech grade from Aldrich) and 32 mL octadecene (ODE) (90% tech grade from Aldrich) are added to the flask. The flask is set clamped on a heating mantle. One of the necks of the flask is fitted with a condenser connected to a Schlenck line through a vacuum adaptor. A temperature probe connected to a digital temperature controller is fitted to one of the two remaining flask necks. The third neck of the flask is then fitted with a septum cap. The contents of the flask are degassed at 80° C. for 20 minutes in vacuo (200 millitorr).

Separately 0.035 g of sulfur (99.99% Strem) is weighed into a septum capped vial including a stir bar. 10 mL ODE (tech grade) is added to the vial. The vial is heated in an oil bath (connected to the Schlenck line) under vacuum to 80° C. and degassed for 20 minutes. After 20 minutes, vacuum lines are closed, the vial is back-filled with nitrogen and the temperature is raised to 130° C. to dissolve sulfur in ODE. When all the sulfur is dissolved into ODE, the vial is removed from the oil bath and allowed to cool to room temperature under nitrogen atmosphere.

When the degassing time is completed, the contents of the three necked flask is stirred at a low stir rate (e.g., a setting of 4) and heated to 290° C. and held for 20 minutes at that temperature. Then temperature is raised to 310° C. under nitrogen. When the temperature reaches 305° C., stir rate is increased (e.g., from a setting of 4 to a setting of 5) and the sample is allowed to heat to 310° C. until all the oxides have dissolved to give a clear solution. The temperature controller is then set to 300° C. Once the temperature falls to 300° C., approximately 8 mL of S in ODE is rapidly injected after which stir rate is maintained (e.g., at a setting of 5). The temperature of the solution is observed to fall to about 265-270° C. and climb back to 300 C in ~5 minutes. After 3 hours, heating is stopped by removing the heating mantle and the flask is allowed to cool to room temperature. The contents of the flask are transferred to a degassed vial under nitrogen, which is transferred to an inert atmosphere box for further purification. Precipitation of dots may be observed, keep overnight in inert box.

The purification method is as follows:

The solution is divided in half, each half being added to a separate centrifuge tubes and centrifuged for 5 min, 4000 rpm. For each tube, the solvent is poured off and the solid retained in the tube. 20 mL butanol is added to each tube, followed by mixing, and then centrifuging. The supernatant butanol is decanted and discarded. 10 mL methanol is then added to each tube, followed by mixing and centrifuging. The supernatant methanol is decanted and discarded. 10 mL hexane is then added to each tube, followed by mixing and centrifuging. Each tube is centrifuged again The supernatant hexane collected from each tube is then poured into a clean tube. (The solids are discarded.) The nanoparticles in each vial are precipitated by the addition of 20 mL butanol. The vial is centrifuged and the liquid decanted and discarded. 10 mL methanol is then added to each tube, followed by mixing and centrifuging. The supernatant is discarded. The resulting solid is dispersed in anhydrous hexane and filtered through a 0.2 micron filter.

B. Overcoating CdZnS Cores to Prepare CdZnS/ZnS Semiconductor Nanocrystals 5 mL oleylamine and 5 mL trioctylphosphine are added to a degassed 4 necked flask equipped with a condenser and temperature probe connected to a digital temperature controller. The condenser is connected to a Schlenck line. The contents of the flask are degassed at 100° C. for 2 hours.

In a glove box, precursor reagents are prepared as follows:
  28 mg diethyl zinc is added to a vial containing 4 mL TOP
  81 mg hexamethyl disilthiane is added to another vial containing 4 mL TOP.
The contents of the two vials are drawn into two separate syringes and capped.

After 2 hours of degassing, the temperature in the flask is reduced to 70° C. Vacuum lines are closed and the flask is opened to a positive nitrogen atmosphere line. 3.3 mL cores (0.092 mmol) dispersed in hexane is drawn into a syringe in the glove box and injected into the flask. The nitrogen line is closed and the flask is slowly opened to the vacuum lines to extract hexane from the flask. Degassing is continued under vacuum until all of the hexane is removed. Once the degassing is completed, the vacuum lines are closed and positive nitrogen atmosphere is introduced into the flask.

The needles on the syringes containing the precursor reagents are removed and replaced with microcapillary tubes, the other end of which is in vials through syringe needle. Air bubbles are removed from the syringes and the syringes are set on a syringe pump ready for injection of the contents into the flask. The flow rate of the syringe pump is adjusted for a flow rate of 50 microliters per minute.

The temperature of the flaks is raised to 170° C. The end of the microcapillary tube attached to the syringe containing hexamethyl disilthiane is introduced into the second septa of the flask using an 18 gauge needle and place in such a way that the type of the microcapillary tube is immersed into the contents of the flask. When the temperature reaches 170° C., the injection of hexamethyl disilthiane is started. After a delay of 2 minutes, the tip of the microcapillary tube of the other syringe containing the diethyl zinc precursor reagent is introduced into the flask with an 18 gauge needle through the other septum of the flask.

Once the addition of the two precursor reagents is completed, the temperature of the flask is allowed to drop to 90° C. and the contents of the flask is transferred into a degassed vial using a 20 mL syringe.

The vial containing the reaction mixture is then transferred into the glove box for isolation of the nanoparticles from the reaction mixture.

10 mL of [anhydrous] hexane is added to the vial in the glove box. The reaction mixture is then divided in half, each half being added to two separate centrifuge tubes. 20 mL 1:3 isopropanol:methanol solvent mixture is added to each of the tubes, after which each is mixed in the vortex and centrifuged. The supernatant is discarded. 5 mL hexane is added to each tube and 1:3 isopropanol:methanol solvent mixture is added dropwise to each tube to reprecipitate the nanoparticles. A slight excess of the solvent mixture is added. The contents of each tube is mixed and centrifuged. The supernatant is discarded and the precipitated nanoparticles are re-dispersed in 5 mL hexane.

For additional information concerning the preparation of quantum dots, see also International Application No. PCT/US2007/013152, filed Jun. 4, 2007, of Coe-Sullivan, et al., for "Light-Emitting Devices And Displays With Improved Performance" and International Application No. PCT/US2007/24305, filed Nov. 21, 2007, of Breen, et al., for "Blue Light Emitting Semiconductor Nanocrystal And Compositions And Devices Including Same", each of which is hereby incorporated herein by reference in its entirety.

Yellow-Emitting Quantum Dot Preparation

A. Synthesis of CdSe Cores:

2 mmol cadmium acetate was dissolved in 35.8 mmol of tri-n-octylphosphine at 140° C. in a 20 mL vial and then dried and degassed for one hour. 62 mmol of trioctylphosphine oxide and 8 mmol of octadecylphosphonic acid were added to a 250 mL 3-neck flask and dried and degassed at 120° C. for one hour. After degassing, the Cd solution was added to the oxide/acid flask and the mixture was heated to 270° C. under nitrogen. Once the temperature reached 270° C., 32.3 mmol of tri-n-butylphosphine was injected into the flask. The temperature was brought back to 270° C. where 4.4 mL of 1.5 M TBP-Se was then rapidly injected. The heating mantle was immediately removed from the reaction flask and the temperature of the reaction was allowed to cool to room temperature. The first absorption peak of the nanocrystals reached 515 nm. The CdSe cores were precipitated out of the growth solution inside a nitrogen atmosphere glovebox by adding a 3:1 mixture of methanol and isopropanol. The isolated cores were then dispersed in hexane and used to make core-shell materials.

B. Overcoating of CdSe Cores to Synthesis of CdSe/CdZnS Core-Shell Nanocrystals:

25.86 mmol of trioctylphosphine oxide and 2.4 mmol of octadecylphosphonic acid were loaded into a 50 mL four-neck flask. The mixture was then dried and degassed in the reaction vessel by heating to 120° C. for about an hour. The flask was then cooled to 70° C. and the hexane solution containing isolated CdSe cores (0.1 mmol Cd content) was added to the reaction mixture. The hexane was removed under reduced pressure and then 2.4 mmol of decylamine was added to the reaction mixture. Dimethyl cadmium, diethyl zinc, and hexamethyldisilathiane were used as the Cd, Zn, and S precursors, respectively. The Cd and Zn were mixed in equimolar ratios while the S was in two-fold excess relative to the Cd and Zn. The Cd/Zn (0.37 mmol of dimethylcadmium and diethylzinc) and S (1.46 mmol of hexamethyldisilathiane) samples were each dissolved in 4 mL of trioctylphosphine inside a nitrogen atmosphere glove box. Once the precursor solutions were prepared, the reaction flask was heated to 155° C. under nitrogen. The precursor solutions were added dropwise over the course of 2 hours at 155° C. using a syringe pump. After the shell growth, the nanocrystals were transferred to a nitrogen atmosphere glovebox and precipitated out of the growth solution by adding a 3:1 mixture of methanol and isopropanol. The resulting precipitate was then dispersed in hexane and precipitated out of solution for a second time by adding a 3:1 mixture of methanol and isopropanol. The isolated core-shell nanocrystals were then dispersed in hexane and used to make light emitting devices including quantum dots as described below.

II. Test Devices of Table 1

A. Fabrication of Standard (Comparative) Test Device

A standard device was fabricated that includes R-SOP (CdSe/CdZnS core-shell semiconductor nanocrystals) and charge transport layers comprising organic materials. The device was made as follows:

Glass (50 mm×50 mm) with patterned indium tin oxide (ITO) electrode on one surface (obtained from Osram Malaysia) is cleaned in an oxygen plasma for about 6 minutes to remove contaminants and oxygenate the surface. The cleaning takes place on 100% oxygen at about 20 psi. The glass is placed on a water cooled plate to help control the increase in temperature during cleaning.

A layer of hole injection material (PEDOT, obtained from H. C. Starck, GmbH) (HIL) is spun onto the surface of the glass including the patterned electrode at a speed of 4000 RPM, to a thickness of about 750 Angstroms. This step is carried out under ambient conditions (i.e., not in a glove box). The PEDOT coated glass is then heated on a 120° C. hot plate in a chamber (<20 ppm water & <10 ppm oxygen), in a HEPA filter environment (approx. Class 1), in a nitrogen atmosphere for >20 minutes to dry the PEDOT. The PEDOT coated glass is then allowed to cool to room temperature.

A layer of hole transport material (N,N'-bis(3-methylphenyl)-N,N'-bis(phenyl)-spiro (spiro-TPD) (OLED grade, gradient sublimation purified) from Luminescent Technologies, Taiwan)) is then evaporated onto the PEDOT layer in a deposition chamber (an ÅMOD chamber, obtained from Angstrom Engineering, Ottowa, Canada) after the chamber is pumped down to $10^{-6}$ torr or better. (In Table 1 and Figures, spiro-TPD is referred to as E105.)

The spiro-TPD coated glass is then returned to the nitrogen environment and stamp-printed with an ink including the SOP CdSe/CdZnS core-shell semiconductor nanocrystals in hexane. The emissive layer has a thickness of approximately one monolayer of quantum dots. [OD=0.03]

After printing, the device was returned to the deposition chamber and pumped back down to $10^{-6}$ torr or better for evaporation of the next layer, which can be a hole blocking layer or an electron transport layer.

A layer of electron transport material of Alq3 (OLED grade, gradient sublimation purified) from Luminescent Technologies, Taiwan) is deposited.

Each of the vapor deposited layers are patterned with use of shadow masks. After deposition of the electron transport material layer, the mask is changed before deposition of the metal cathode.

The details of the materials and layer thickness for the Standard device are summarized in Table 1 below.

B. Fabrication of Other Test Devices Identified in Table 1

The devices identified in Table 1 (other than the above-described Standard device) were generally fabricated as set forth below. The details of each device (materials, thicknesses, etc) are set forth in Table 1 below.

Glass (50 mm×50 mm) with patterned indium tin oxide (ITO) electrode on one surface (obtained from Osram Malaysia) is cleaned in an oxygen plasma for about 6 minutes to remove contaminants and oxygenate the surface. The cleaning takes place on 100% oxygen at about 20 psi. The glass is placed on a water cooled plate to help control the increase in temperature during cleaning.

An electron transport layer comprising zinc oxide is prepared as follows. A zinc acetate [Zn(ac)] solution (157 g/L) in 96% 2-methoxy ethanol and 4% ethanolamine is spun coated at 2000 rpm onto the ITO. (The zinc acetate was obtained from Sigma Aldrich.)

Subsequent annealing at 300° C. on hot plate for 5 minutes in air converts Zn(ac) to Zinc oxide. Rinsing of the annealed Zn(ac) layer in de-ionized water, ethanol and acetone is expected to remove any residual organic material from the surface, leaving only crystalline ZnO film with nanoscale domain size. Then the nanoparticle film is baked at 200° C. to remove the solvent residue. The thickness of ZnO film is confirmed by profilometer, typically around 45 nm for single spin.

The metal oxide coated glass is then transferred into nitrogen-filled glove box, which normally has oxygen and water levels below 1 ppm. A coating formulation including quantum dots in hexane is spun coated on ZnO surface at 3000 rpm for 1 minute. The quantum dot film thickness is optimized by using various optical density solutions. Through the device performance optimization, the thickness of quantum dot film is kept around 25 nm, and is confirmed by atomic force microscopy (AFM).

After the quantum dots are deposited, the device is returned to the deposition chamber and pumped back down to $10^{-6}$ torr or better for evaporation of the next layer.

A 50 nm layer of hole transport material (N,N'-bis(3-methylphenyl)-N,N'-bis(phenyl)-spiro (spiro-TPD) (OLED grade, gradient sublimation purified) from Luminescent Technologies, Taiwan)) is then evaporated onto the emissive layer in a deposition chamber (an ÅMOD chamber, obtained from Angstrom Engineering, Ottowa, Canada) after the chamber is pumped down to $10^{-6}$ torr or better. The hole transport material are typically (OLED grade, gradient sublimation purified) obtained from Luminescent Technologies, Taiwan)).

A hole injection layer (5% F4-TCNQ and E-105) (20 nm) is formed over the hole transport layer by co-evaporation techniques similar to those described above for preparing the hole transport layer.

Each of the vapor deposited layers are patterned with use of shadow masks. After deposition of the hole transport material layer and hole injection layer, the mask is changed before deposition of a 100 nm Al anode.

TABLE 1

| Device | Cathode | ETL | QD | HTL | HIL | Anode |
|---|---|---|---|---|---|---|
| Standard Device | LiF/Al (5Å/100 nm) | Alq$_3$ (50 nm) | SOP (~1 monolayer) | E-105 (50 nm) | PEDOT:PSS | ITO |
| Red Device (FIG. 4) | ITO | ZnO | SOP (OD 0.025) | E-105 (50 nm) | 5% F4-TCNQ & E-105 | Al |
| Green Device (FIG. 5A) | ITO | ZnO | GQD (OD 0.025) | E-105 (50 nm) | 5% F4-TCNQ & E-105 | Al |
| Blue Device (FIG. 5B) | ITO | ZnO | BQD (OD 0.025) | E-105 (50 nm) | 5% F4-TCNQ & E-105 | Al |

Figure 3:
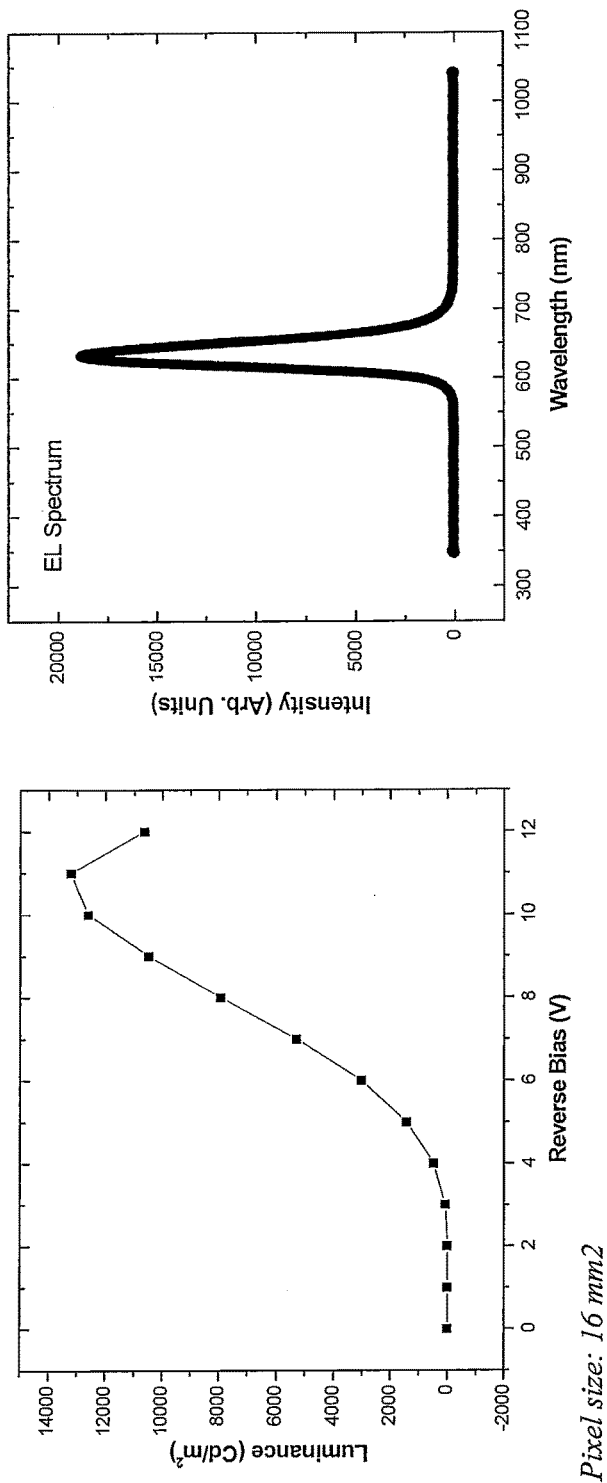
FIGS. 3 & 4 graphically present performance data for the Red Light Emitting Device of the Examples.
Figure 4:
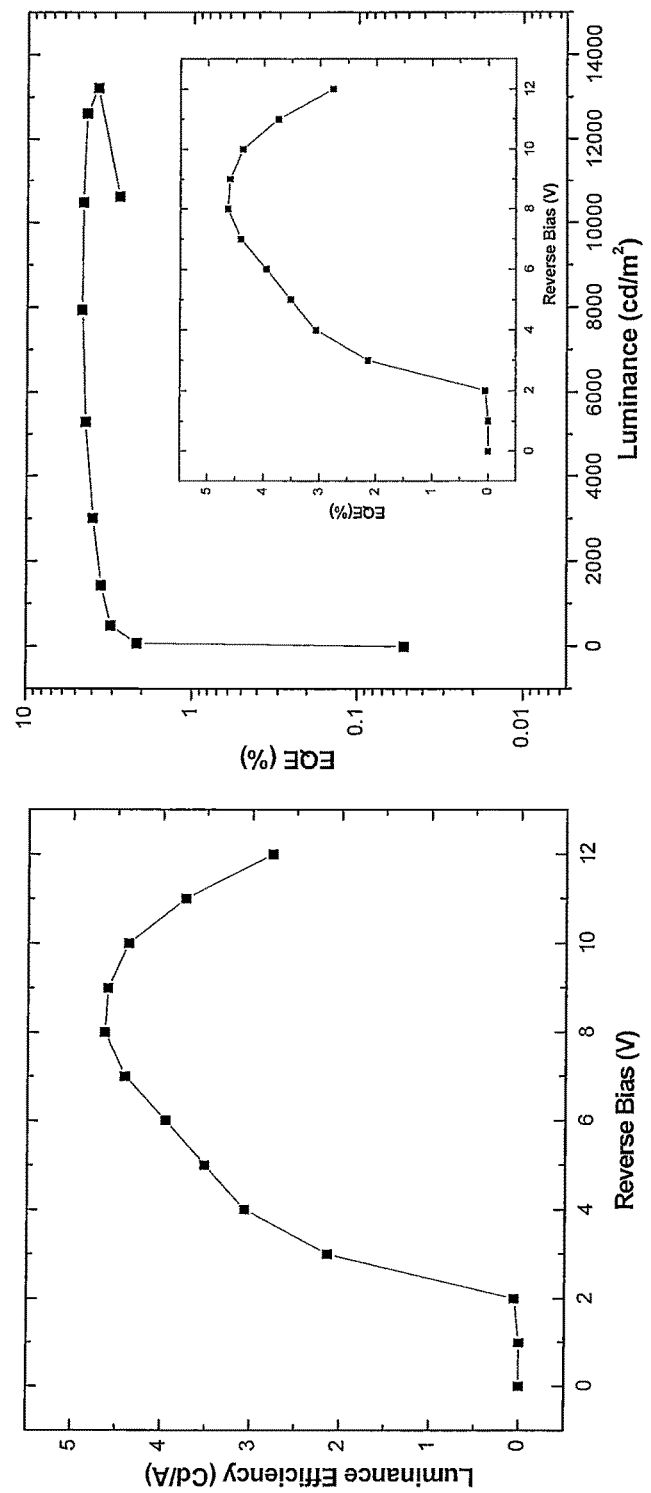
Figure 6:
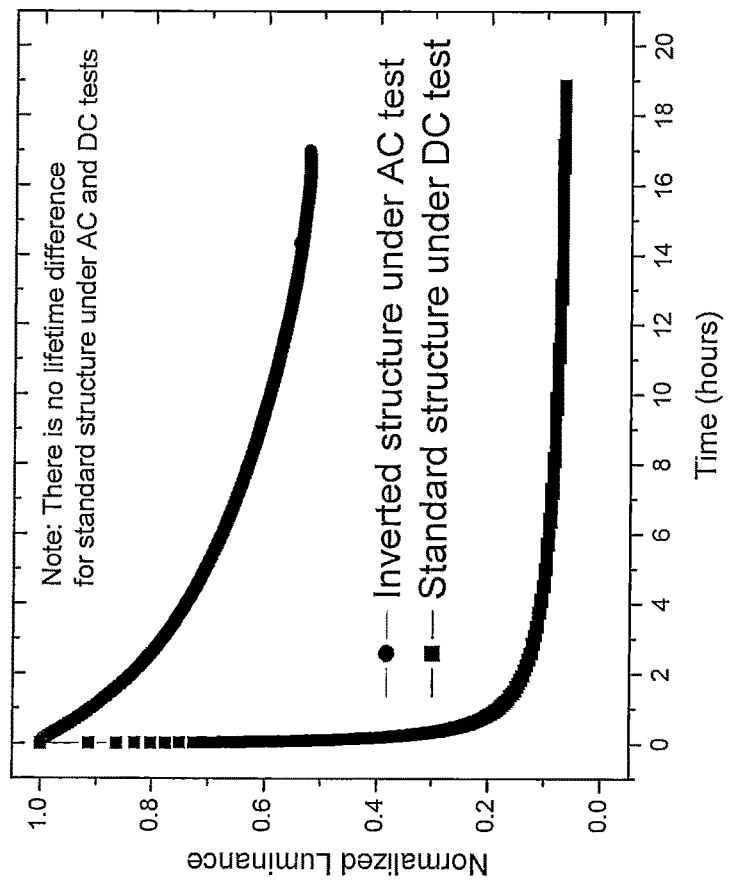
FIG. 6 graphically compares lifetime data for the Red Light Emitting Device of the Examples (indicated as "inverted structure" in the figure) and the Standard Light Emitting Device (a comparative device) described in the Examples (indicated as "standard structure" in the figure).

Various performance data for the devices of Table 1 are graphically presented in FIGS. 3-6. FIGS. 3 and 4 graphically present performance data for the Red Device described in Table 1. FIG. 5 graphically presents performance data for the Green Device (A) and Blue Device (B) of the Examples. Lifetime improvements that can be achieved in certain embodiments of the invention are illustrated in FIG. 6, which graphically present lifetime data for the Red Device and the Standard Device of the Examples.

In certain embodiments, a device is preferably baked or heated after fabrication, but before encapsulation. In certain embodiments, baking (e.g., at 80° C. on a hot plate in a nitrogen atmosphere) can improve device performance.

III. Test Devices of Table 2

The devices identified in Table 2 were generally fabricated as set forth below. The details of each device (materials, thicknesses, etc) are set forth in Table 2 below. (Layer thicknesses for the test devices are listed in Table 2 parenthetically.)

A. Sol Gel Metal Oxide Synthesis:

TiOx Preparation:

The sol-gel procedure for producing TiOx is as follows: titanium(IV) isopropoxide (Ti[OCH(CH$_3$)$_2$]4, Aldrich, 99.999%, 10 mL) was prepared as a precursor and mixed with 2-methoxyethanol (CH$_3$OCH$_2$CH$_2$OH, Aldrich, 99.9+%, 50 mL) and ethanolamine (H$_2$NCH$_2$CH$_2$OH, Aldrich, 99+ %, 5 mL) in a three-necked flask equipped with a condenser, a thermometer, and an argon-gas inlet/outlet. Then, the mixed solution was heated to 80° C. for 2 h in a silicon-oil bath under magnetic stirring, followed by heating to 120° C. for 1 h. The two-step heating (80 and 120° C.) was then repeated. The typical TiOx precursor solution was prepared in isopropyl alcohol.

ZnO Preparation:

Test devices identified in Table 2 that include a ZnO layer were fabricated on patterned ITO substrates that were sonicated in acetone and isopropyl alcohol for 10 minutes each, followed by 6 minutes O$_2$ plasma treatment. A zinc acetate (99.999% grade from Sigma-Aldrich) [Zn(ac) solution (157 g/L) in 96% 2-methoxy ethanol (from Alfa) and 4% ethanolamine (from Sigma-Aldrich) was spin coated at 2000 rpm onto the ITO. This step is carried out under ambient conditions (i.e., not in a glove box). Subsequent annealing at 300° C. for 30 minutes in air converted the Zn(ac) to ZnO. The resulting film was rinsed in de-ionized water, methanol, acetone and methanol then dried in the glove box (<1 ppm water & <1 ppm oxygen) at 200° C. for 5 minutes on hot plate.

Mixed ZnO—TiOx Preparation:

The spin coating sol-gel formulations used to fabricate a mixed ZnO—TiOx layer utilized a mixture of a ZnO spin coating sol-gel formulation (prepared substantially as described above) and a TiOx spin coating sol-gel formulation (prepared substantially as described above). The ZnO and TiOx formulations are mixed in a predetermined proportion.

B. Device Fabrication Process

Glass (50 mm×50 mm) with patterned indium tin oxide (ITO) electrode on one surface (obtained from Thin Film Devices, Anaheim, Calif.) is cleaned in oxygen plasma for about 6 minutes to remove contaminants and oxygenate the surface. The cleaning takes place on 100% oxygen at about 20 psi. The glass is placed on a water cooled plate to help control the increase in temperature during cleaning.

An electron transport layer comprising a metal oxide was formed by sol-gel technique (ZnO and/or TiO$_x$, as indicated in Table 2). prepared substantially as described above). The metal oxide coated glass is then returned to the nitrogen environment and spin-coated with an ink including quantum dots in hexane. In order to get rid of residual solvent trapped in the quantum dot layer, post-baking on partial finished device at 80° C. on hot plate (in glove box) is favorable. Then, the device is returned to the deposition chamber and pumped back down to 10$^{-7}$ torr or better for evaporation of the next layer.

A layer of hole transport material is then evaporated onto the emissive layer in a deposition chamber (an ÁMOD chamber, obtained from Angstrom Engineering, Ottowa, Canada) after the chamber is pumped down to 10$^{-7}$ torr or better. The hole transport material are typically (OLED grade, gradient sublimation purified) obtained from Luminescent Technologies, Taiwan).

If a hole injection layer is included in the device, it is formed over the hole transport layer. Each of the vapor deposited layers are patterned with use of shadow masks. After deposition of the hole transport material layer and hole injection layer, the mask is changed before deposition of the metal anode.

After device fabrication done in evaporation chamber, the finished device is encapsulated with glass lid and ready for testing.

TABLE II

| Device | Cathode | ETL | OD | HTL | HIL | Anode |
|---|---|---|---|---|---|---|
| A | ITO | — | RQD (~35 nm) | spiro-NPB (55 nm) | LG-101 (15 nm) | Al (100 nm) |
| B | ITO/Al(5 nm) | — | RQD (~35 nm) | spiro-NPB (55 nm) | LG-101 (15 nm) | Al (100 nm) |
| C | ITO/Al(5 nm) | — | RQD (35 nm) | spiro-NPB (55 nm) | LG-101 (15 nm) | Al (100 nm) |
| E | ITO | ZnO (45 nm) | RQD (35 nm) | spiro-NPB (60 nm) | LG-101 (10 nm) | Al (100 nm) |
| F | ITO | ZnO:TiOx (1:1) (45 nm) | RQD (35 nm) | spiro-NPB (60 nm) | LG-101 (10 nm) | Al (100 nm) |
| G | ITO | ZnO:TiOx (2:1) (45 nm) | RQD (35 nm) | spiro-NPB (60 nm) | LG-101 (10 nm) | Al (100 nm) |
| H | ITO | TiOx (45 nm) | RQD (35 nm) | spiro-NPB (60 nm) | LG-101 (10 nm) | Al (100 nm) |
| I | ITO | ZnO (45 nm) | RQD (35 nm) | spiro-NPB (55 nm) | LG-101 (15 nm) | Al (100 nm) |
| J | ITO | ZnO (45 nm) | RQD (35 nm) | spiro-NPB (55 nm) | WO$_3$ | Al (100 nm) |
| K | ITO | ZnO (45 nm) | RQD (35 nm) | spiro-NPB (55 nm) | — | Al (100 nm) |
| L | ITO | ZnO (45 nm) | RQD (35 nm) | spiro-NPB (55 nm) | WO$_3$ | Al (100 nm) |
| M (FIG. 11 & 12) | ITO | ZnO (45 nm) | RQD (35 nm) | spiro-NPB (55 nm) | LG-101 (15 nm) | Al (100 nm) |
| N (FIG. 13 & 14) | ITO | ZnO (45 nm) | YQD (35 nm) | spiro-NPB (55 nm) | LG-101 (15 nm) | Al (100 nm) |

Various performance data for the devices of described in Table 2 are graphically presented in FIGS. 7-15.

Figure 7:
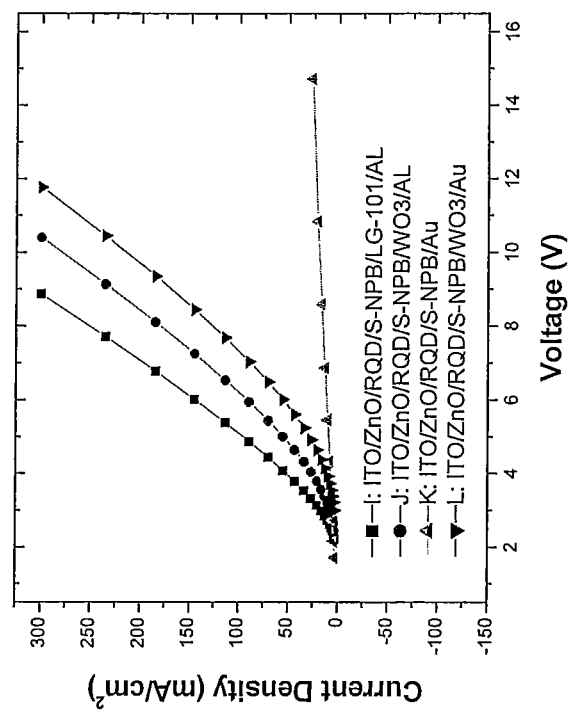
FIG. 7 depicts an I (current)-V (voltage) curves for devices that include hole injection layers and a device without a hole injection layer.

FIG. 7 shows I-V curves of inverted structures with LG-101 and WO3 as hole injection layers respectively. Device K is inverted structure with no hole injection layer. From the data, device K has insufficient current injection through anode.

Figure 8:
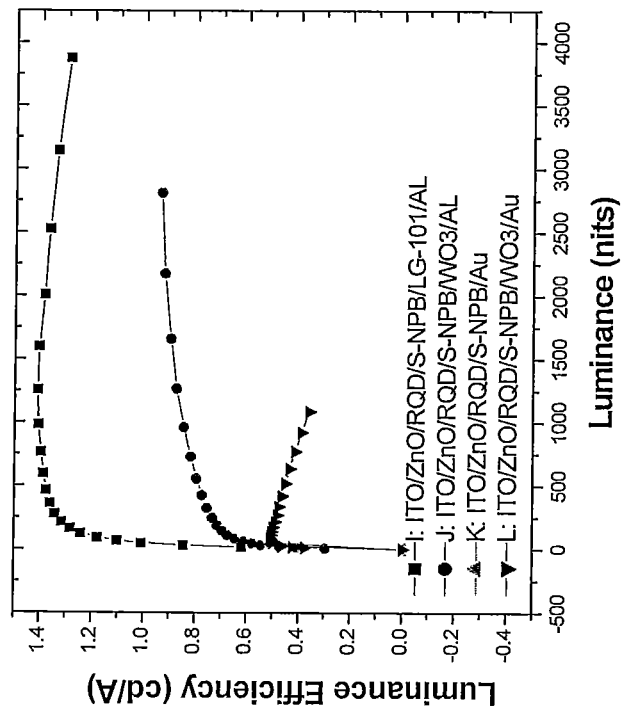
FIG. 8 shows device luminance efficiency for different device structures.

FIG. 8 shows device luminance efficiency in different device structures. The most efficient device is a device in accordance with an embodiment of the invention that includes small molecular material LG 101 as hole injection layer. Without a hole injection layer, luminance (see Device K) is not observable.

Figure 9:
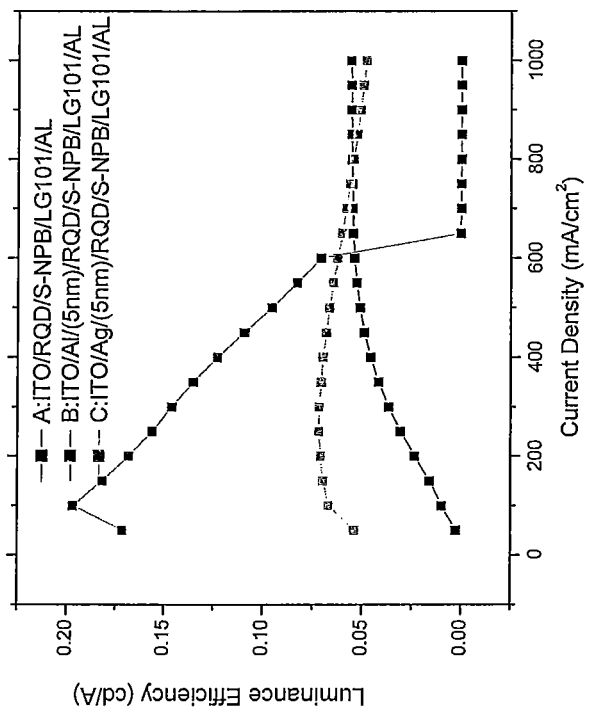
FIG. 9 shows luminance efficiency of a device without an electron transport and hole blocking layer.

FIG. 9 shows the luminance efficiency of a device without an electron transport & injection layer and without a hole blocking layer.

Figure 10:
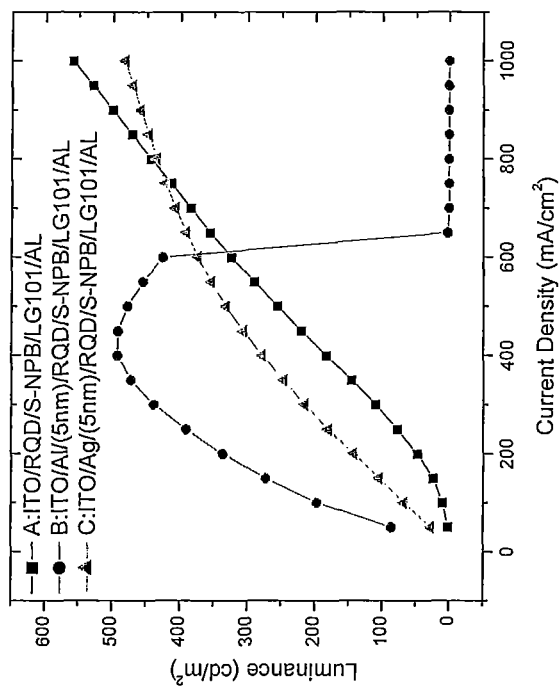
FIG. 10 shows luminance of inverted device without either a hole blocking or electron transport and injection layer.

FIG. 10 shows luminance of inverted device without an electron transport & injection layer and without a hole blocking layer.

Figure 11:
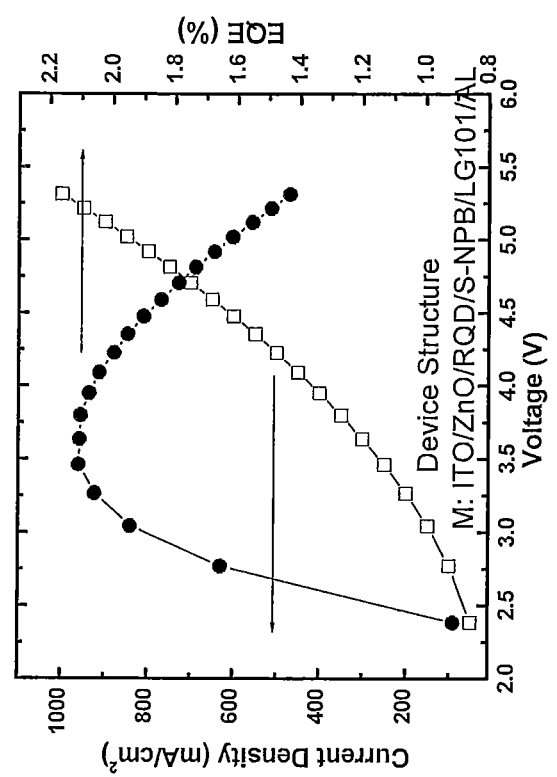
FIG. 11 shows performance data for an example of device in accordance with an embodiment of the invention.

FIG. 11 shows device performance for a device in accordance with an embodiment of the invention that includes an emissive layer including red-light emitting quantum dots. Peak external quantum efficiency (EQE) 2.1% reaches at 3.46 v with brightness of 9671 nits.

Figure 12:
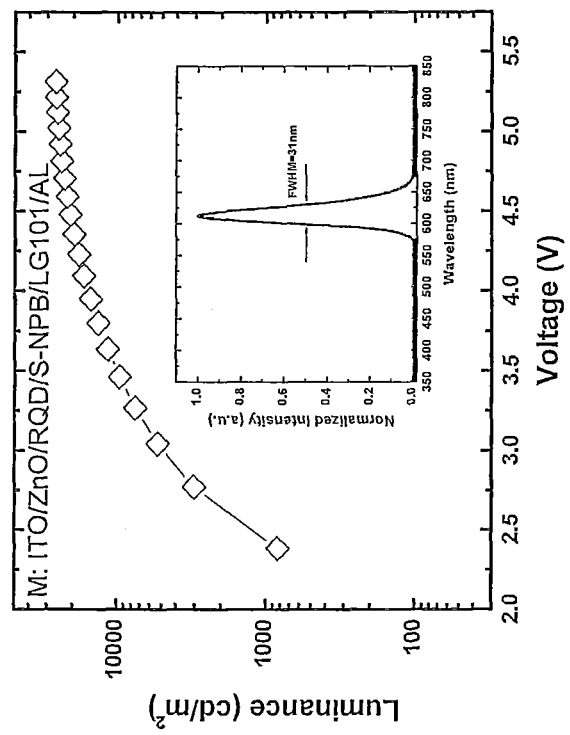
FIG. 12 shows operating voltage for an example of a red light emitting device in accordance with an embodiment of the invention.

FIG. 12 shows a device in accordance with an embodiment of the invention that includes an emissive layer including red-light emitting quantum dots operating at very low voltage. Inset is EL spectrum of this device. It is noticed that the turn on voltage for this device is extremely low.

Figure 13:
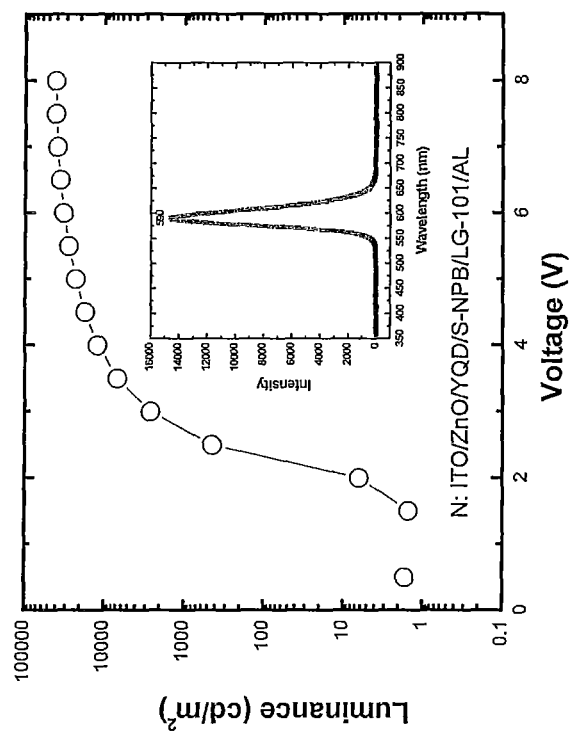
FIG. 13 shows operating voltage for an example of an orange light emitting device in accordance with an embodiment of the invention.

FIG. 13 shows a device in accordance with an embodiment of the invention that includes an emissive layer including yellow-light emitting quantum dots operating at very low voltage. The turn on voltage for this device is below the energy required to overcome band gap of yellow emitter, which is 2.1 V. Inset is EL spectrum of a yellow quantum dot light emitting device. Peak brightness 41300 cd/m2 is obtained at 8V.

Figure 14:
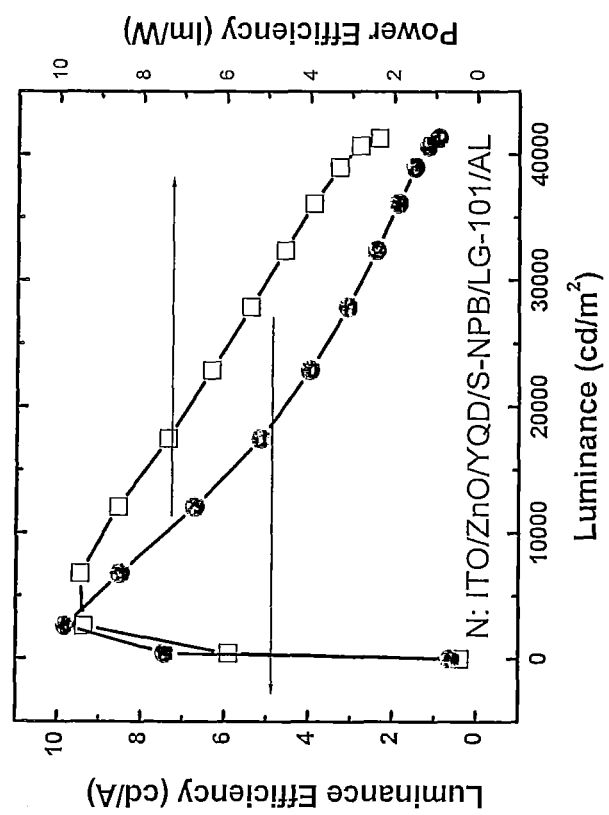
FIG. 14 shows efficiency at certain luminance for an example of an orange light emitting device in accordance with an embodiment of the invention.

FIG. 14 shows efficiency of Device N at certain luminance. The peak luminance efficiency 9.8 lm/W reaches at 3V with 2620 nits. The peak luminance efficiency 9.46 cd/A reaches at 3.5V with 6800 nits.

Figure 15:
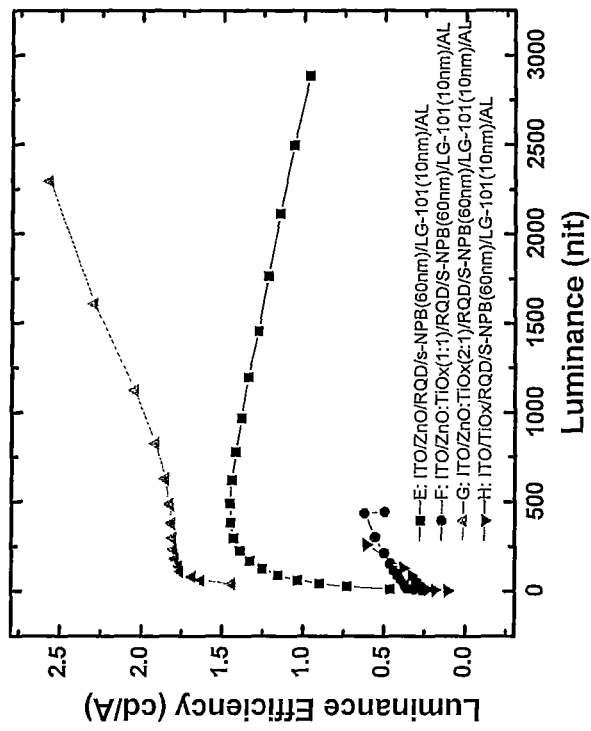
FIG. 15 shows performance for an example of a device in accordance with any embodiment of the invention.

FIG. 15 shows examples of mixing ZnO with TiOx, which may improve the device efficiency by charge balance.

Light-emitting devices in accordance with various embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, a sign, lamps and various solid state lighting devices.

Other materials, techniques, methods, applications, and information that may be useful with the present invention are described in: International Application No. PCT/US2007/008873, filed Apr. 9, 2007, of Coe-Sullivan et al., for "Composition Including Material, Methods Of Depositing Material, Articles Including Same And Systems For Depositing Material"; International Application No. PCT/US2007/09255, filed Apr. 13, 2007, of Anc, et al., for "Methods Of Depositing Material, Methods Of Making A Device, And System"; International Application No. PCT/US2007/003411, filed Feb. 8, 2007, of Beatty, et al., for "Device Including Semiconductor Nanocrystals And A Layer Including A Doped Organic Material And Methods"; International Application No. PCT/US2007/14711, filed Jun. 25, 2007, of Coe-Sullivan, for "Methods For Depositing Nanomaterial, Methods For Fabricating A Device, And Methods For Fabricating An Array Of Devices"; International Application No. PCT/US2007/14705, filed Jun. 25, 2007, of Coe-Sullivan, et al., for "Methods For Depositing Nanomaterial, Methods For Fabricating A Device, Methods For Fabricating An Array Of Devices And Compositions"; International Application No. PCT/US2007/008705, filed Apr. 9, 2007, of Coe-Sullivan, et al., for "Methods And Articles Including Nanomaterial"; International Application No. PCT/US2007/014706, filed Jun. 25, 2007, of coe-sullivan, et al., for "Methods And Articles Including Nanomaterial"; International Application No. PCT/US2007/003525, filed Feb. 8, 2007, of Coe-Sullivan, et al., for "Displays Including Semiconductor Nanocrystals And Methods Of Making Same"; International Application No. PCT/US2007/008721, filed Apr. 9, 2007, of Cox, et al., for "Methods Of Depositing Nanomaterial & Methods Of Making A Device"; International Application No. PCT/US2007/019797, filed Sep. 12, 2007, of Coe-Sullivan, et al., for "A Composite Including Nanoparticles, Methods, And Products Including A Composite"; International Application No. PCT/US2007/019796, of Coe-Sullivan, et al., filed Sep. 12, 2007, for "Electroluminescent Display Useful For Displaying A Predetermined Pattern"; International Application No. PCT/US2007/24320, filed Nov. 21, 2007, of Clough, et al., for "Nanocrystals Including A Group Ma Element And A Group Va Element, Method, Composition, Device And Other Products"; U.S. Patent Application No. 60/971,887, filed Sep. 12, 2007, of Breen, et al., for "Functionalized Semiconductor Nanocrystals And Method"; U.S. Patent Application No. 60/992,598, filed Dec. 5, 2007, of Breen, et al., "Functionalized Semiconductor Nanocrystals And Method"; International Application No. PCT/US2007/24305, filed Nov. 21, 2007, of Breen, et al., for "Blue Light Emitting Semiconductor Nanocrystal And Compositions And Devices Including Same"; International Application No. PCT/US2007/24306, filed Nov. 21, 2007, of Ramprasad, for "Semiconductor Nanocrystal And Compositions And Devices Including Same"; International Application No. PCT/US2007/013152, filed Jun. 4, 2007, of Coe-Sullivan, et al., for "Light-Emitting Devices And Displays With Improved Performance"; International Application No. PCT/US2007/24750, of Coe-Sullivan, et al., filed Dec. 3, 2007 "Improved Composites And Devices Including Nanoparticles"; International Application No. PCT/US2007/24310, filed Nov. 21, 2007, of Kazlas, et al., for "Light-Emitting Devices And Displays With Improved Performance"; International Application No. PCT/US2007/003677, filed Feb. 14, 2007, of Bulovic, et al., for "Solid State Lighting Devices Including Semiconductor Nanocrystals & Methods", U.S. Patent Application No. 61/016,227, filed 21 Dec. 2007, of Coe-Sullivan et al., for "Compositions, Optical Component, System Including an Optical Component, and Devices", U.S. Patent Application No. 60/949,306, filed 12 Jul. 2007, of Linton, et al., for "Compositions, Methods For Depositing Nanomaterial, Methods For Fabricating A Device, And Methods For Fabricating An Array Of Devices", and U.S. Patent Application No. 60/992,598, filed 5 Dec. 2007. The disclosures of each of the foregoing listed patent documents are hereby incorporated herein by reference in their entireties.

As used herein, the singular forms "a", "an" and "the" include plural unless the context clearly dictates otherwise. Thus, for example, reference to an emissive material includes reference to one or more of such materials.

As used herein, "top" and "bottom" are relative positional terms, based upon a location from a reference point. More particularly, "top" means furthest away from the substrate, while "bottom" means closest to the substrate. For example, for a light-emitting device including two electrodes, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface further away from the substrate. Where, e.g., a first layer is described as disposed or deposited "over" a second layer, the first layer is disposed further away from substrate. There may be other layers between the first and second layer, unless it is otherwise specified. For example, a cathode may be described as "disposed over" an anode, even though there are various organic and/or inorganic layers in between.

The entire contents of all patent publications and other publications cited in this disclosure are hereby incorporated herein by reference in their entirety. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:
1. A light emitting device including:
a pair of electrodes comprising
an anode, and
a cathode, wherein at least one of the anode and the cathode comprises indium tin oxide;
a layer comprising a light emissive material comprising quantum dots provided between the electrodes;
a layer comprising an inorganic material provided between the emissive layer and the cathode;
a layer comprising a hole transporting material provided between the emissive layer and the anode; and
a layer comprising a hole-injection material provided between the anode and the layer comprising the hole transporting material,
wherein the inorganic material comprises a crystalline zinc oxide,
wherein the layer comprising the inorganic material comprises a stratified structure including three or more horizontal zones having different conductivities from each other, and
wherein the three or more horizontal zones comprise,
a first zone at an upper portion of the layer nearer the emissive layer, the first zone comprising a hole blocking material,
a third zone at a lower portion of the layer more remote from the emissive layer, the third zone comprising an electron injecting material, and
a second zone between the first zone and the third zone, the second zone comprising an electron transporting material,
wherein the hole blocking material comprises an intrinsic inorganic material,
the electron injecting material comprises a first slightly n-doped inorganic material, and
the electron transporting material comprises a second slightly n-doped inorganic material having a lower concentration of n-type doping than the first slightly n-doped inorganic material.

2. A light emitting device in accordance with claim 1 wherein the inorganic material included in each of the first zone, the second zone, and the third zones of the stratified structure can be doped or undoped forms of the same or different materials.

3. A light emitting device in accordance with claim 2 wherein electron and hole populations are balanced at the emissive layer of the device.

4. A light emitting device in accordance with claim 1 wherein the inorganic material comprises a metal chalcogenide.

5. A light emitting device in accordance with claim 1 wherein the inorganic material comprises a metal oxide.

6. A light emitting device in accordance with claim 1 wherein the inorganic material comprises zinc oxide.

7. A light emitting device in accordance with claim 6 wherein the zinc oxide is surface treated with an oxidizing agent to render a surface proximate to the emissive layer intrinsic.

8. A light emitting device in accordance with claim 1 wherein the inorganic material comprises a mixture of two or more inorganic materials.

9. A light emitting device in accordance with claim 1 wherein the inorganic material comprises an inorganic semiconductor material.

10. A light emitting device according to claim 1, wherein the cathode comprises indium tin oxide.

11. A light emitting device in accordance with claim 1 wherein the third zone comprises an n-type doped zinc oxide, the second zone comprises an n-type doped zinc oxide having a lower n-type dopant concentration than that of the zinc oxide in the third zone, and the first zone comprises intrinsic zinc oxide.

12. A light emitting device in accordance with claim 1 wherein the inorganic material comprises a mixture of the crystalline zinc oxide and a titanium oxide.

13. A light emitting device in accordance with claim 1, wherein the hole transporting material comprises a first organic material and the hole injection material comprises a second organic material different from the first organic material or an inorganic material.

* * * * *